United States Patent
Strobel et al.

(10) Patent No.: US 11,876,622 B2
(45) Date of Patent: Jan. 16, 2024

(54) LDPC ENCODER AND DECODER FOR MULTI-MODE HIGHER SPEED PASSIVE OPTICAL NETWORKS

(71) Applicant: Intel Corporation, Santa Clara, CA (US)

(72) Inventors: Rainer Strobel, Munich (DE); Santhosh K. Vanaparthy, Santa Clara, CA (US)

(73) Assignee: Intel Corporation, Santa Clara, CA (US)

(*) Notice: Subject to any disclaimer, the term of this patent is extended or adjusted under 35 U.S.C. 154(b) by 183 days.

(21) Appl. No.: 17/201,032

(22) Filed: Mar. 15, 2021

(65) Prior Publication Data

US 2021/0297182 A1 Sep. 23, 2021

Related U.S. Application Data

(60) Provisional application No. 62/992,623, filed on Mar. 20, 2020.

(51) Int. Cl.
*H04B 10/516* (2013.01)
*H04B 10/69* (2013.01)
(Continued)

(52) U.S. Cl.
CPC ........... *H04L 1/0061* (2013.01); *H04B 10/27* (2013.01); *H04B 10/50* (2013.01); *H04B 10/516* (2013.01); *H04B 10/66* (2013.01); *H04B 10/69* (2013.01); *H04L 1/0042* (2013.01); *H04L 1/0047* (2013.01)

(58) Field of Classification Search
None
See application file for complete search history.

(56) References Cited

U.S. PATENT DOCUMENTS 10,263,644 B1* 4/2019 Mazahreh .......... H03M 13/1111
2006/0251194 A1* 11/2006 Bublil ............... H04L 25/03127
375/348

(Continued)

OTHER PUBLICATIONS

Strobel: "Error Correction Coding for Passive Optical Networks", Feb. 27, 2019, pp. 1-15, https://www.ce.cit.tum.de/fileadmin/w00cgn/Int/events/OWHTC/strobl_owhtc19.pdf (Year: 2019).*

(Continued)

*Primary Examiner* — Li Liu
(74) *Attorney, Agent, or Firm* — 2SPL Patentanwälte PartG mbB; Yong Beom Hwang

(57) ABSTRACT

Examples relate to a Forward Error Correction (FEC) encoder, an FEC decoder, Passive Optical Network (PON) systems, an Optical Line Terminal (OLT), an Optical Networking Unit (ONU), and to corresponding methods and computer programs. A forward-error-correction (FEC) encoder that is suitable for generating FEC data for use with hard-decision input at a receiver and for use with soft-decision input at the receiver is configured to generate the FEC data based on payload bits using a Low-Density Parity-Check (LDPC) code. The generated FEC data is generated using a single LDPC code that is suitable for use with soft-decision input and hard-decision input at the receiver or using one of two LDPC codes that are suitable for soft-decision input and hard-decision input, respectively.

14 Claims, 7 Drawing Sheets

(51) Int. Cl.
*H04L 1/00* (2006.01)
*H04B 10/27* (2013.01)
*H04B 10/50* (2013.01)
*H04B 10/66* (2013.01)

(56) References Cited

U.S. PATENT DOCUMENTS

| | | | |
|---|---|---|---|
| 2013/0058642 A1* | 3/2013 | Bouda | H04B 10/278 398/25 |
| 2015/0263760 A1* | 9/2015 | Hof | H03M 13/3707 714/758 |
| 2016/0028417 A1* | 1/2016 | Yu | H03M 13/45 714/776 |
| 2017/0111198 A1* | 4/2017 | Park | H04L 27/38 |
| 2017/0149528 A1* | 5/2017 | Kim | H03M 13/6393 |
| 2018/0076930 A1* | 3/2018 | Buchali | H04B 10/5161 |
| 2018/0294921 A1* | 10/2018 | Miyata | H03M 13/6561 |
| 2022/0021481 A1* | 1/2022 | Liu | H03M 13/6362 |

OTHER PUBLICATIONS

LAN/MAN Standards Committee of the IEEE Computer Society: "Draft Standard for Ethernet Amendment: Physical Layer Specifications and Management Parameters for 25 Gb/s and 50 Gb/s Passive Optical Networks"; IEEE P802.3caTM/D3.1; Jan. 22, 2020; pp. 1-269.

International Telecommunication Union—Telecommunication Standardization Sector: "LDPC Annex for G.hsp.ComTC"; SG15-C2186; Study Group 15; E-Meeting, Sep. 7-9, 2020; pp. 1-5.

* cited by examiner

LDPC ENCODER AND DECODER FOR MULTI-MODE HIGHER SPEED PASSIVE OPTICAL NETWORKS

FIELD

Examples relate to a Forward Error Correction (FEC) encoder, an FEC decoder, Passive Optical Network (PON) systems, an Optical Line Terminal (OLT), an Optical Networking Unit (ONU), and to corresponding methods and computer programs.

BACKGROUND

Data rates in passive optical networks (PON) are increasing, e.g., to 50 Gbit/s per wavelength. With increasing transmission speed, the quality of signal transmission may be reduced. For user data, this is mitigated by improved forward error correction (FEC). For example, Low-Density Parity-Check Codes (LDPC) can be used to implement FEC.

BRIEF DESCRIPTION OF THE FIGURES

Some examples of apparatuses and/or methods will be described in the following by way of example only, and with reference to the accompanying figures, in which.

DETAILED DESCRIPTION

Figure 1A:
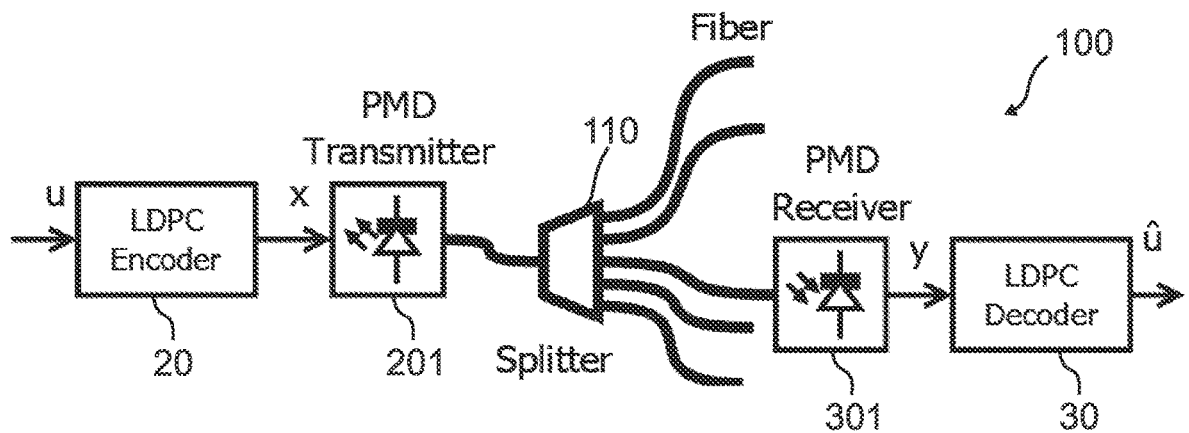
FIG. 1a shows a schematic diagram of a passive optical network system, illustrating a passive optical network downstream transmission according to an example.

Some examples are now described in more detail with reference to the enclosed figures. However, other possible examples are not limited to the features of these examples described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an 'or', this is to be understood as disclosing all possible combinations, i.e., only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

The present disclosure relates to passive optical networks (PON), and in particular, to a system and a method for receiver having a multi-mode low-density parity-check (LDPC) decoder. The present disclosure may provide an LDPC encoder and decoder for multi-mode higher speed passive optical networks.

Soft-decision FECs, such as LDPC, are a viable approach for providing FEC for PON transmissions, as they can operate close to channel capacity and hardware-friendly encoder and decoder implementations exist. While the 25 Gbit/s systems may use a hard-decision receiver, systems with 50 Gbit/s and higher transmission speed may use soft input receivers, based on analog-to-digital converters (ADC) and digital equalization. LDPC codes can be optimized for soft input or hard input, which gives different code matrices. The transceiver hardware at the optical line termination (OLT) side as well as at the optical network unit (ONU) side usually supports multiple modes and transmission speeds, e.g., 10 Gbit/s, 25 Gbit/s, and 50 Gbit/s. This disclosure presents approaches for LDPC encoders and decoders optimized for hard and soft input to reduce complexity for a multi-mode transceiver.

Some implementations of PON systems use hard-decision FECs, mostly Reed-Solomon codes. In such implementations, there usually is no option to adjust the FEC to the receiver or channel type. In case that multiple different FECs are supported, they are placed next to each other as separate hardware to switch between them, depending on the transmission speed.

Similarly, when using FEC based on LDPC codes, which are characterized by a parity check matrix H, to support multiple LDPC code matrices optimized for different receiver architectures (hard input and soft input), the encoder and decoder may require extra hardware to support multiple matrices. There may be some limited re-use of the encoder and decoder circuit for an encoder and decoder for multiple codes.

This disclosure proposes devices, systems, and methods for LDPC-coded PON transmission supporting hard and soft input channels. Different code settings or code matrices may be constructed in a way that the same LDPC encoder and decoder hardware can be used or certain blocks can be re-used for both cases. For example, the LDPC matrix may be built such that simple modifications of the matrix, e.g., a change of the punctured bits or a swap of columns of the LDPC parity-check matrix is sufficient to have an LDPC code matrix optimized for one or the other receiver type. Hardware structures which support encoding and decoding for a base matrix as well as one or more modified matrices with improved efficiency are presented.

The present disclosure may yield performance improvements, e.g., a lower bit error rate, with the different LDPC matrices optimized for a certain receiver structure or channel. At the same time, compared to a transceiver architecture where multiple different FECs for different channel or receiver types are used, the hardware complexity of the presented approach may be reduced.

FIG. 1a shows a schematic diagram of a passive optical network system, illustrating a passive optical network downstream transmission according to an example. The passive optical network is a point-to-multipoint system. Data is transmitted from the central node, the OLT, to multiple ONUs connected with fiber cables and passive optical splitters. For downstream transmission, as shown in FIG. 1a, the incoming data u is encoded by the LDPC encoder 20 to create encoded data x, which is then converted to an optical signal in the PMD (physical media dependent layer) transmitter 201. At the ONU side, the PMD receiver 301 converts the incoming optical signals to electrical signals y and the LDPC decoder 30 recovers the transmitted bit stream û. The LDPC code may be described as a block code, where K incoming bits are processed in one step and R redundancy bits are added to codeword of N=K+R bits. To adjust the code rate (the ratio between payload bits and codeword size) and to improve the code performance, the LDPC code may be shortened by S bits or Punctured by P bits. Herein, "shortening" means that some of the payload bits are not transmitted, which decreases the code rate. Puncturing means that some of the parity bits are not transmitted, which increases the code rate. Given an LDPC code, a maximal number of bits may be shortened to fit just the payload data. Similarly, enough bits may be punctured to fit in the codeword size. Overall, the code rate is $$cr = \frac{K-S}{N-S-P}.$$

One LDFL codeword in the downstream direction may contain data from different ONUS.

Figure 1B:
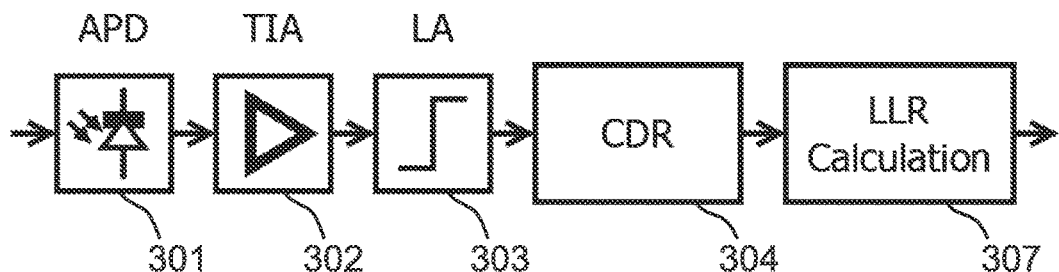
FIG. 1b shows a schematic diagram of an example of a hard-decision receiver.

There are different receiver architectures, which may be used for different transmission speeds. For example, for transmission speeds up to 25 Gbit/s, a hard-decision receiver, as shown in FIG. 1b, may be used. In this context, a hard-decision receiver may be a receiver that is suitable for handling hard-decision input, i.e., input that is defined in binary terms. A soft-decision receiver may be a receiver that is suitable for soft-decision input, i.e., input that is defined in non-binary terms, e.g., across a probability range.

In the context of the present disclosure, the terms "soft input" and "soft-decision input" may be used interchangeably, and the terms "hard input" and "hard-decision input" may be used interchangeably. Soft-decision input may be input that is defined in non-binary terms, e.g., across a probability range. Hard-decision input may be input that is defined in binary terms. An input signal that comprises, or is based on, soft-decision input may be an input signal, where analog values of the received input signal are translated into non-binary values, e.g., represented across a probability range using log-likelihood-ratio values. An input signal that comprises, or is based on, hard-decision input may be an input signal, where the analog values of the received input signal are translated into binary values. These binary values may in turn be represented using log-likelihood-ratio values, e.g., using two pre-defined log-likelihood-ratio values to represent the binary 0's and 1's.

FIG. 1b shows a schematic diagram of an example of a hard-decision receiver. In the hard-decision decoder, the optical signal may be converted into an electrical signal with an avalanche photo diode (APD) 301, which may implement the PMD receiver, amplified by a transimpedance amplifier (TIA) 302 and converted to a digital signal using a limiting amplifier (LA) 303. This may be followed by a clock-data recovery (CDR) block 304 and a log-likelihood ratio (LLR) calculation block 307 which may be used to generate the input signal for the LDPC decoder.

Figure 1C:
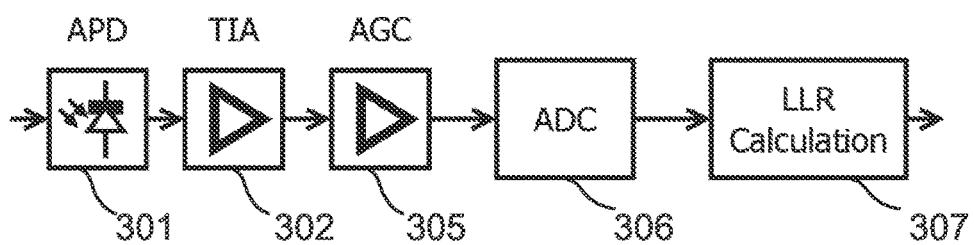
FIG. 1c shows a schematic diagram of a soft-decision receiver.

For transmission speeds beyond 25 Gbit/s, a higher LDPC coding gain may be achieved with a soft-decision receiver as shown in FIG. 1c. FIG. 1c shows a schematic diagram of a soft-decision receiver according to an example. In the soft-decision decoder, the optical signal may be converted into an electrical signal with an avalanche photo diode (APD) 301, which may implement the PMD receiver, amplified by a transimpedance amplifier (TIA) 302, amplified with an automatic gain control (AGC) 305 to a constant level and then converted to a digital signal by an analog-to-digital converter (ADC) 306. With that, the LLR calculation block 307 can use the amplitude information to derive the input signal for the LDPC.

In many cases, the PMD components (APD 301+TIA 302+LA 303 or APD 301+TIA 302) may be part of an optics module. The following components, from the CDR 304 or the ADC 306 onwards may be part of the digital transceiver device.

Thus, the digital transceiver that supports both, soft and hard input receiver architectures may support both types of optical modules. An LDPC code may be optimized for the hard input channel or the soft input channel. In this context, the term "optimized" is not necessarily limited to a process that yields a single optimal result, but rather to a process that aims at improving the performance of a metric, without necessarily yielding the optimal result. For example, an LDPC code that is "optimized" for the hard input channel or the soft input channel may be an LDPC that has been designed to be suitable for both the hard input channel or the soft input channel, but might not necessarily be "the" optimal LDPC for hard-decision input or soft-decision input. The present disclosure relates to different approaches for a digital receiver and/or transmitter (e.g., transceiver) supporting hard and soft-decision input forward error correction.

Examples of the proposed approaches are enumerated in four options below: In a first example, the LDPC code is optimized for a trade-off between soft-decision and hard-decision input. Thus, the transmitter may remain the same irrespective of the receiver module. Depending on the receiver optical module, the LLR calculation block may be switched between hard input and soft input mode. This may enable a full re-use of the encoder and decoder circuitry for use with soft-decision input and hard-decision input.

In a second example, the same LDPC code is used for hard-decision input and soft-decision input, but the number and the position of the puncturing and shortening bits may be changed. Again, this may enable re-use of the encoder and decoder circuitry for use with soft-decision input and hard-decision input, with some overhead for switching between the different sets of puncturing/shortening bits. For example, a number of (e.g., a set of) puncturing bits $P_H$ and shortening bits $S_H$ may be used for the hard-decision case and different numbers (e.g., a different set of) $P_S$ and $S_S$ may be used for the soft-decision case. For example, the puncturing bits $P_H$ and $P_S$ may be placed in the parity portion of the H matrix, so that the encoding can be performed in the systematic fashion (i.e., so the user data may be a part of the transmitted codeword) in both the hard-decision and the soft-decision cases. If either of the puncturing bits $P_H$ or $P_S$ are not part of the parity portion of the H matrix, then the columns in H may be permuted to obtain the matrix H' so that the punctured columns $P_H$ and $P_S$ are both in the parity portion of H', with the encoder/decoder being designed for the permuted matrix H'.

In a third example, two LDPC encoders and decoders for different codes may be implemented in the transmitter and the receiver. In this case, each of the LDPC codes may be optimized for one of the FEC settings. The device may switch between the different codes, e.g., a first parity-check matrix $H_H$ may be used for hard-decision input and a second parity-check matrix $H_S$ may be used for soft-decision input.

In a fourth example, the LDPC code for soft-decision input may be derived from the code for hard-decision input by simple modifications of the parity-check matrix. This may enable some re-use of circuitry, while benefitting from LDPC codes that are optimized for one of the FEC settings, respectively. This can be done by an exchange of columns of the matrix, for example. To change the behavior of the code by an exchange of columns in the matrix, columns may be changed from the unpunctured into the punctured bits and from data into parity. As an example, the parity check matrix for the hard-decision input is $H_H=[h_1, \ldots, h_N]$ with N columns and the corresponding soft-decision matrix may be derived by swapping the last P columns with the first P columns $H_S=[h_{N-P+1}, \ldots, h_N, h_{N-P}, h_1, \ldots, h_P]$.

Figure 2A:
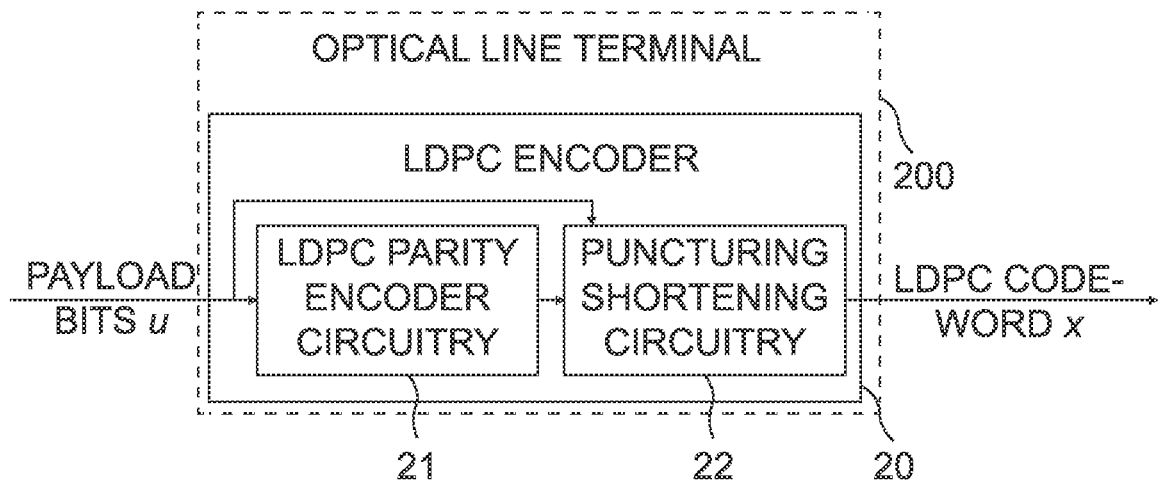
FIG. 2a shows a block diagram of an example of a forward error correction encoder, and of an optical line terminal comprising a forward error correction encoder.

In the following, a forward correction encoder and corresponding method is introduced. FIG. 2a shows a block diagram of an example of a forward error correction (FEC) encoder 20, and of an optical line terminal (OLT) 200 comprising the forward error correction encoder 20. Optionally, the OLT may further comprise an FEC decoder, e.g., the FEC decoder 30 introduced in connection with one of FIGS. 3a to 3f. For example, the OLT may be the OLT shown in connection with FIG. 4a. For example, the OLT 200 may be part of a Passive Optical Network (PON) system, e.g., the PON system 100 of FIG. 1a or the PON system 400 of FIG. 4.

The FEC encoder is suitable for generating FEC data for use with hard-decision input at a receiver and for use with soft-decision input at the receiver. The encoder is configured to generate the FEC data based on payload bits using a Low-Density Parity-Check (LDPC) code. The generated FEC data is generated using a single LDPC code that is suitable for use with soft-decision input and hard-decision input at the receiver, or using one of two LDPC codes that are suitable for soft-decision input and hard-decision input, respectively.

Figure 2B:
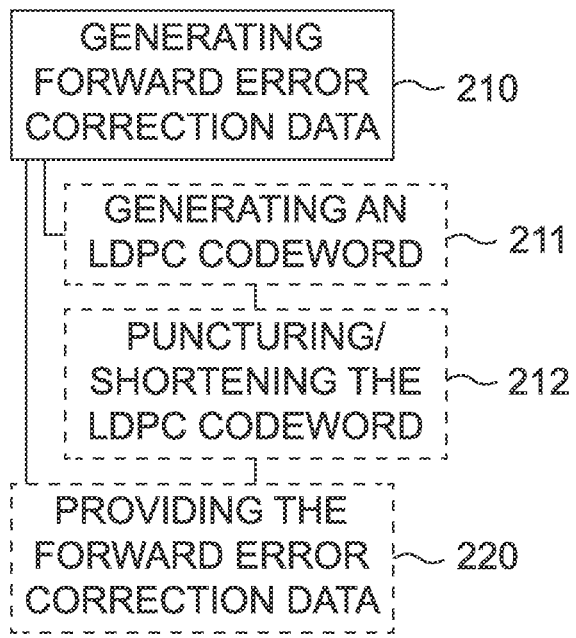
FIG. 2b shows a flow chart of an example of a forward error correction encoding method.

FIG. 2b shows a flow chart of an example of a corresponding FEC encoding method that is suitable for generating the FEC data for use with hard-decision input at a receiver and for use with soft-decision input at the receiver. The encoding method comprises generating 210 the FEC data based on payload bits using an LDPC code. The generated FEC data is generated using a single LDPC code that is suitable for use with soft-decision input and hard-decision input at the receiver or using one of two LDPC codes that are suitable for soft-decision input and hard-decision input, respectively.

The following description relates both to the FEC encoder shown in FIG. 2a and to the corresponding method of FIG. 2b. Features introduced in connection with the FEC encoder may be likewise applied to the FEC encoding method, and vice versa.

In the context of the present disclosure, the term "FEC encoder" 20 is used as term for the device being configured to provide the encoding functionality. In general, the FEC encoder 20 may comprise circuitry or means 21; 22 configured to provide the functionality of the FEC encoder. For example, the circuitry or means 21; 22 may be implemented using application-specific circuitry, using a digital signal processor, or using a programmable hardware component, such as a processor. For example, as shown in FIGS. 2c to 2f, the FEC encoder 20 may comprise LDPC parity encoder circuitry 21 and puncturing/shortening circuitry 22. Correspondingly, the FEC encoder may comprise means 21 for performing LDPC parity encoding and means 22 for performing puncturing/shortening. As shown in FIGS. 2c to 2f, the FEC encoder 20 may further comprise interconnects for internally connecting the circuitry or means of the FEC, and switching circuitry or switching means for selectively applying signals to the circuitry and/or means. For example, the switches may be controlled based on a soft/hard input signal 23.

The FEC encoder 20 is suitable for generating FEC data, e.g., LDPC codewords, for use with hard-decision input at a receiver and for use with soft-decision input at the receiver. In other words, the encoder is capable of generating FEC data that can be used, by the receiver, with soft-decision input (i.e., by a decoder that is suitable for processing soft-decision input), and/or with hard-decision input (i.e., by a decoder that is suitable for processing hard-decision input). In some cases, the FEC data that is suitable for use with soft-decision input at the receiver may correspond to the FEC data that is suitable for use with hard-decision input at the receiver, i.e., the same FEC data may be used for soft-decision input and hard-decision input. Alternatively, the FEC data may be adapted depending on whether soft-decision input or hard-decision input is used at the receiver, i.e., the FEC data for use with soft-decision input may differ from FEC data for use with hard-decision input. However, the FEC encoder is capable to generate FEC data that can be used with soft-decision input and hard-decision input at the receiver.

The FEC encoder is configured to generate the FEC data based on payload bits using an LDPC code. LDPC codes are codes that are being used to provide both error detection and error correction for codewords comprising LDPC parity information. Such codewords are, for example, used in communication systems for transmitting information over a lossy channel, or in memory or storage applications, where transmission and/or memory/storage errors can be recovered using such codes. The component "low-density" in LDPC refers to the sparseness of the H matrix, in which only few non-zero elements (e.g., logical ones, or other non-binary values when a non-binary LDPC code is used) are interspersed among zeros. In general, an LDPC decoder takes an LDPC codeword as an input, and uses a so-called parity-check matrix (also called H matrix) to calculate a syndrome of the codeword (using a matrix multiplication). In general, an LDPC code is characterized by its parity-check matrix H. As the name suggests, the parity-check matrix H may be used to check an LDPC codeword x for validity. The syndrome indicates whether the codeword is correct—if the syndrome is 0 (i.e., all bits of the logical syndrome are logical 0) the codeword is correct. If not, or rather as long as this is not the case (and a maximal number of iterations has not been reached), an iterative process involving message passing is used to correct the code word, by passing "messages" between the variable bit nodes (of the codeword) and the so-called check nodes (of the syndrome) according to a decoder algorithm. A valid codeword satisfies the parity-check equation H·x=0. For a more efficient hardware implementation, the calculation may be split into two steps according to $p=H_R^{-1}H_L u$ where $H_L$ and $H_R$ are parts of the parity-check matrix $H=[H_L\ H_R]$. From the R×N matrix H, $H_L$ is the left part of size R×K and $H_R$ is the right part of size R×R. The LDPC codeword $x=[x_1, \ldots, x_K]^T$ may comprise or consist of a payload portion u and a parity portion $p=[p_1, \ldots, p_R]^T$ according to $$x = \begin{bmatrix} u \\ p \end{bmatrix}$$

The LDPC encoder may calculate the parity bits p from the data (payload) bits and append them to the codeword. The parity bits may be calculated with the generator matrix G according to p=G·u, with the generator matrix G being the counterpart to the parity-check matrix H. Accordingly, the FEC encoder may be configured to generate the parity bits p using the generator matrix G of the LDPC code from the payload bits u, and to concatenate the payload bits u and the parity bits x to obtain the LDPC codeword. In other words, the FEC encoder may be configured to generate 211 the LDPC codeword from the payload bits using the LDPC code. After generating the LDPC codeword, shortening and/or puncturing may be applied on the LDPC codeword. In other words, the FEC encoder may be configured to perform shortening and/or puncturing 212 on the LDPC codeword. Herein, "shortening" means that some of the payload bits are not transmitted and are set to some fixed values, and Puncturing means that some of the parity bits are not transmitted. Therefore, the FEC encoder may be configured to remove a subset of the payload bits to shorten the LDPC codeword, and/or to remove a subset of the parity bits to puncture the LDPC codeword. For example, the FEC data may correspond to the LDPC codeword, or to the shortened or punctured LDPC codeword. The FEC encoder may be further configured to provide 220 the FEC data, e.g., the LDPC codeword or the shortened or punctured LDPC codeword.

As outlined above, the FEC generated can be generated using one of two general approaches—using a single LDPC code that is suitable for use with soft-decision input and hard-decision input at the receiver, or using one of two LDPC codes that are suitable for soft-decision input and hard-decision input, respectively.

For example, the FEC data may be generated using the same LDPC code for use with hard-decision input at the receiver and for use with soft-decision input at the receiver. Consequently, the FEC data that is suitable for use with soft-decision input at the receiver may correspond to the FEC data that is suitable for use with hard-decision input at the receiver, i.e., the same FEC data may be used for soft-decision input and hard-decision input. For example, the LDPC code being used may be suitable for, or optimized for, use with hard-decision input and soft-decision input. For example, the FEC data may be generated with a single LDPC code where performance is balanced for good performance with hard-decision input and soft-decision input. Alternatively, the same LDPC code may be used, but different sets of bits may be used for shortening/puncturing. In other words, the FEC data may be generated using a single LDPC code that uses a first set of puncturing bits and/or a first set of shortening bits for use with soft-decision input at the receiver and second set of puncturing bits and/or a second set of shortening bits for use with hard-decision input at the receiver. In other words, the FEC encoder may be configured to perform shortening and/or puncturing using a first set of puncturing bits and/or a first set of shortening bits for use with soft-decision input at the receiver and to perform shortening and/or puncturing using a second set of puncturing bits and/or a second set of shortening bits for use with hard-decision input at the receiver. For example, the first and second set of shortening bits may be disjoint, and the first and second set of puncturing bits may be disjoint. In other words, a single LDPC code may be that uses different puncturing and/or shortening pattern (and/or number of puncturing/shortening bits) when working with soft-decision input vs. working with hard-decision input.

For the first two examples mentioned before, where the same parity-check matrix is used, and only the puncturing and/or shortening is changed, the generator matrix G might not change between hard and soft-decision configuration. Only the subset of actually transmitted bits might change, e.g., $x_H=[u_1, \ldots, u_{K-SH}, p_1, \ldots, p_{R-PH}]^T$ for hard-decision and $x_S=[u_1, \ldots, u_{K-SS}, \ldots, p_{R-PS}]^T$ for soft-decision input. If the matrix H was permuted to obtain H' so as to encode the data in the systematic fashion, then the generator matrix G' may be adapted according to the corresponding permuted matrix H'.

Figure 2C:
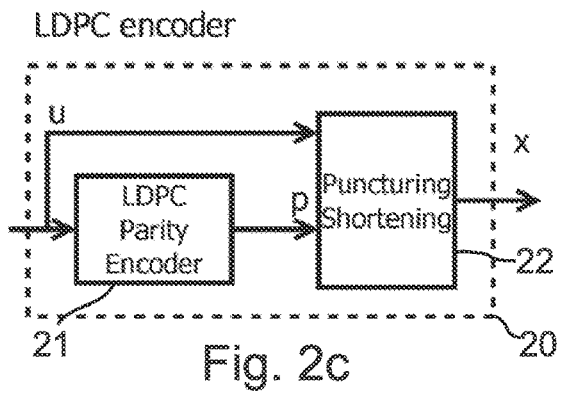
FIG. 2c shows a schematic diagram of an example of a low-density parity-check code encoder using the same encoder for hard and soft input.

FIG. 2c shows a schematic diagram of an example of a low-density parity-check code encoder using the same encoder for hard and soft input. The payload bits u are provided to the LDPC parity encoder 21 and to the puncturing/shortening block 22, along with the parity bits p generated by the LDPC parity encoder 21. The puncturing/shortening block provides the codeword x. In FIG. 2c, the same sets of bits are used for puncturing/shortening in the hard-decision and soft-decision case.

Figure 2D:
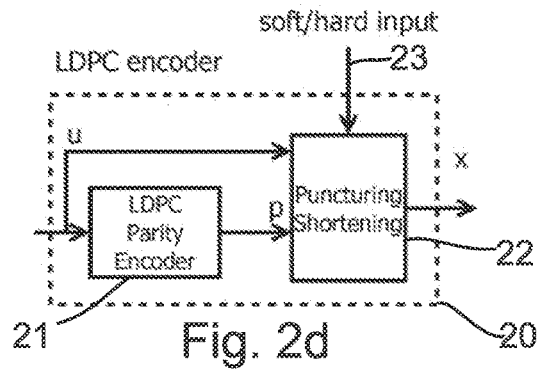
FIG. 2d shows a schematic diagram of an example of a low-density parity-check code encoder using the same encoder for hard and soft input with different puncturing and/or shortening.

FIG. 2d shows a schematic diagram of an example of a low-density parity-check code encoder using the same encoder for hard and soft input with different puncturing and/or shortening. In contrast to the encoder of FIG. 2c, a soft/hard input selection signal 23 is provided to the puncturing/shortening block 22, so the puncturing/shortening block 22 punctures or shortens the appropriate set of bits for hard-decision decoding or soft-decision decoding. In other words, the FEC encoder of FIG. 2d may be configured to provide the soft/hard input selection signal 23 to the puncturing/shortening block 22, and to puncture or shorten the LDPC codeword according to the soft/hard input selection signal 23.

Alternatively, as outlined above, the FEC data may be generated using two LDPC codes. For example, one of the LDPC codes may be used for use with soft-decision input at the receiver and the other LDPC code may be used for use with hard-decision input at the receiver. In this case, the LDPC codeword, and thus the FEC data, may by generated based on different LDPC codes, depending on whether the FEC data is generated for use with soft-decision input or hard-decision input at the receiver. Accordingly, one of the LDPC codes may be optimized for hard-decision input and the other LDPC code may be optimized for soft-decision input. Again, there are (at least) two options—two entirely separate LDPC codes may be used, or one of the LDPC codes may be derived from the other. In other words, the LDPC code being used to generate FEC data for use with soft-decision input may be independent from the LDPC code being used to generate FEC data for use with hard-decision input. In this case, the FEC encoder may comprise two sets of encoder circuitry, one for generating FEC data for use with soft-decision input, and the other for generating FEC data for use with hard-decision input.

Figure 2E:
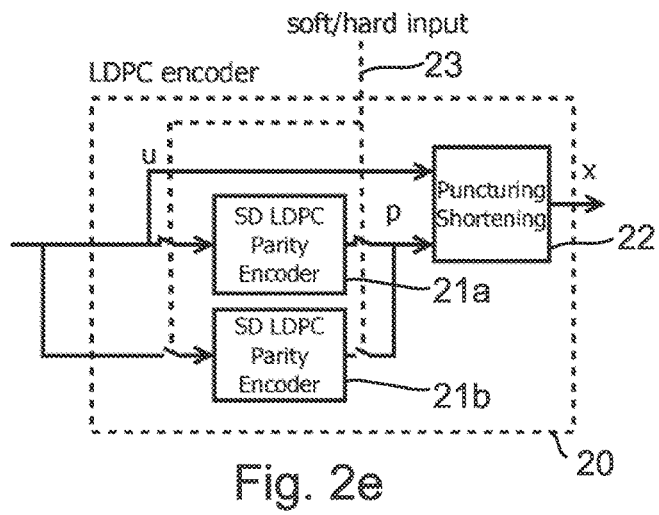
FIG. 2e shows a schematic diagram of an example of a low-density parity-check code encoder using separate code matrices for soft and hard input.

To implement such an FEC encoder, additional hardware may be used to support two generator matrices. FIG. 2e shows a schematic diagram of an example of a low-density parity-check code encoder using separate code matrices (i.e., different LDPC codes) for soft and hard input. In contrast to the encoder of FIG. 2c, a soft/hard input selection signal 23 is provided, which is used to select one of two LDPC parity encoders 21a; 21b to generate the parity bits p from the payload bits u. In other words, the FEC encoder of FIG. 2d may be configured to provide the soft/hard input selection signal 23 to internal switching circuitry of the encoder, in order to select one of the two LDPC parity encoders 21; 21b.

Alternatively, one of the LDPC codes may be derived from each other, so that major portions of the encoder circuitry can be used for generating FEC data for use with soft-decision input and for generating FEC data for use with hard-decision input. For example, one of the LDPC codes may be derived from the other LDPC code via one or more matrix operations.

For example, the derivation may be established by an exchange of columns in the parity-check matrix. For example, the soft-decision matrix (e.g., the LDPC code for generating FEC data for use with soft-decision input) may be derived from the hard-decision-optimized matrix (e.g., the LDPC code for generating FEC data for use with hard-decision input). For example, the LDPC code being used for use with soft-decision input may be derived from the LDPC code being used for use with hard-decision input via an exchange of columns of a parity matrix of the LDPC code being used for use with hard-decision input.

For example, as outlined above, for a more efficient hardware implementation, the calculation may be split into two steps according to $p=H_R^{-1}H_L u$ where $H_L$ and $H_R$ are parts of the parity-check matrix $H=[H_L\ H_R]$. From the R×N matrix H, $H_L$ is the left part of size R×K and $H_R$ is the right part of size R×R. In particular, a large portion of the hardware can be shared between the soft and the hard-decision input case. This matrix multiplication may be adapted to the different matrices being used to generate the LDPC code for use with soft-decision input and for use with hard-decision input. Assuming the encoder operation as given by $p=H_R^{-1}H_L u$, and the corresponding matrices $H_H$ and $H_S$ for hard and soft input, the encoder operation for the hard-decision input may be defined as $$p=[h_{K+1},\ldots,h_N]^{-1}[h_1,\ldots,h_K]u,$$

and for the soft-decision input as $$p=[h_{K+1},\ldots,h_{N-P},h_1,\ldots,h_P]^{-1}[h_{N-P+1},\ldots h_N,h_{P+1},\ldots,h_K]u.$$

Thus, most of the individual operations may be kept the same. For example, in the encoder, the LDPC encoder processing may be performed in multiple smaller steps multiplication of the payload bits vector with a matrix $H_L$ and multiplication with a matrix $H_R^{-1}$, where the parts which are the same for hard and soft input are shared (e.g., the un-changed columns in $H_L$) while other parts (changed columns in $H_L$ and $H_R^{-1}$) are switched between hard input and soft input operation. In other words, the FEC encoder may be configured to generate the FEC data by multiplying, segment-wise, the payload bits with a first matrix (e.g., $H_L$) and with a second matrix (e.g., $H_R^{-1}$). Columns of the first and/or second matrix being used to generate FEC data for use with hard-decision input and soft-decision input may be multiplied using shared circuitry. The remaining columns of the first and/or second matrix (e.g., columns that are specific to use with either soft-decision input or hard-decision input) may be multiplied using circuitry that is switched according to the use of soft-decision input or hard-decision input.

Figure 2F:
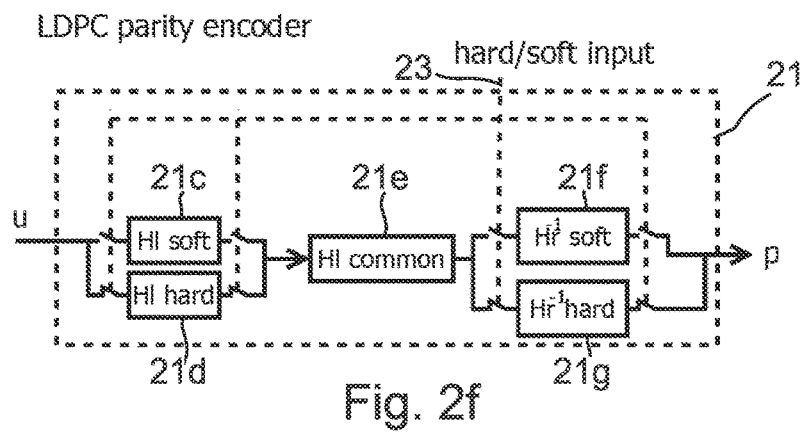
FIG. 2f shows a schematic diagram of an example of a low-density parity-check code encoder where the soft input parity check matrix is derived from the hard input matrix by swapping columns.

FIG. 2f shows a schematic diagram of an example of a low-density parity-check code encoder where the soft input parity check matrix is derived from the hard input matrix by swapping columns. For example, the LDPC parity encoder 21 of FIG. 2f may implement the LDPC parity encoder 21 of FIG. 2c. The LDPC parity encoder 21 comprises encoder circuitry 21c-21g, with circuitry 21c being used to for the multiplication of columns of the $H_L$ matrix that are specific to the "soft-decision input" case, circuitry 21d being used to for the multiplication of columns of the $H_L$ matrix that are specific to the "hard-decision input" case, circuitry 21e being used to for the multiplication of columns of the $H_L$ matrix that are commonly used in the "soft-decision input" and the "hard-decision input" cases, circuitry 21f being used to for the multiplication of columns of the $H_R^{-1}$ matrix that are specific to the "soft-decision input" case, and circuitry 21g being used to for the multiplication of columns of the $H_R^{-1}$ matrix that are specific to the "hard-decision input" case.

More details and aspects of the FEC encoder or the OLT are mentioned in connection with the proposed concept or one or more examples described above or below (e.g., FIG. 1a to 1c, 3a to 4d). The FEC encoder or the OLT may comprise one or more additional optional features corresponding to one or more aspects of the proposed concept or one or more examples described above or below.

Figure 3A:
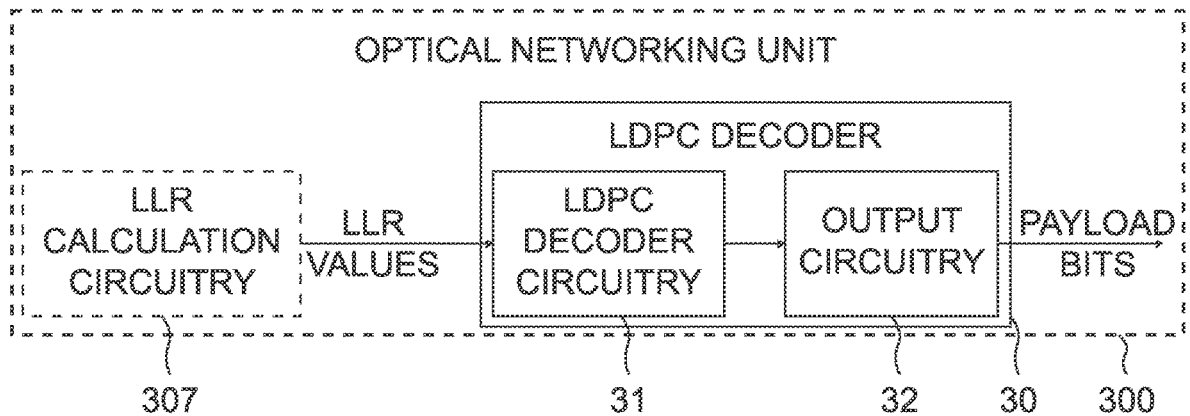
FIG. 3a shows a block diagram of an example of a forward error correction decoder, and of an optical networking unit comprising a forward error correction decoder.

In the following, a forward error correction decoder and corresponding method are introduced. FIG. 3a shows a block diagram of an example of a forward error correction decoder 30, and of an optical networking unit (ONU) 300 comprising a forward error correction decoder 20. Optionally, the ONU may further comprise an FEC encoder, e.g., the FEC encoder 20 introduced in connection with one of FIGS. 2a to 2f. For example, the ONU may be the ONU shown in connection with FIG. 4a. For example, the ONU 300 may be part of a Passive Optical Network (PON) system, e.g., the PON system 100 of FIG. 1a or the PON system 400 of FIG. 4.

The FEC decoder 30 is suitable for use with hard-decision input at a receiver and for use with soft-decision input at the receiver. The FEC decoder 30 is configured to obtain an input signal as LLR values. The FEC decoder 30 is configured to decode the input signal using LDPC iterative decoding that is based on an LDPC code. The input signal is decoded using a single LDPC code that is suitable for use with soft-decision input and hard-decision input at the receiver or using one of two LDPC codes that are suitable for soft-decision input and hard-decision input, respectively.

Figure 3B:
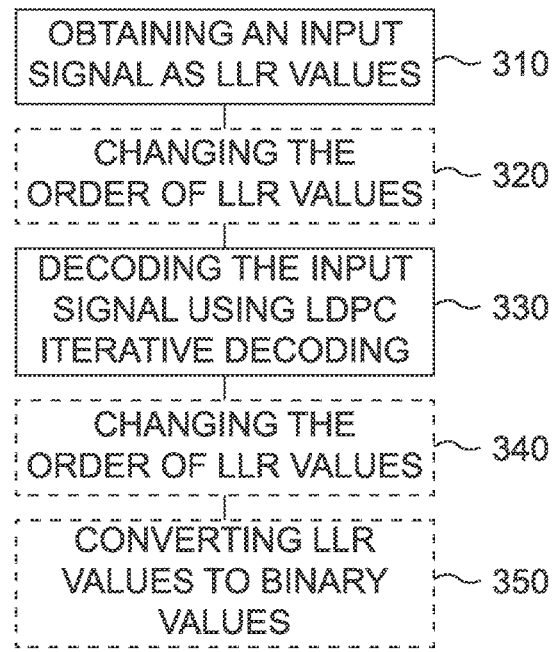
FIG. 3b shows a flow chart of an example of a forward error correction decoding method.

FIG. 3b shows a flow chart of an example of a corresponding FEC decoding method that is suitable for use with hard-decision input at a receiver and for use with soft-decision input at the receiver. The decoding method comprises obtaining 310 an input signal as LLR values. The method comprises decoding 330 the input signal using LDPC iterative decoding that is based on an LDPC code. The input signal is decoded using a single LDPC code that is suitable for use with soft-decision input and hard-decision input at the receiver or using one of two LDPC codes that are suitable for soft-decision input and hard-decision input, respectively.

The following description relates both to the FEC decoder shown in FIG. 3a and to the corresponding decoding method of FIG. 3b. Features introduced in connection with the FEC decoder may be likewise applied to the FEC decoding method, and vice versa.

In the context of the present disclosure, the term "FEC decoder" 30 is used as term for the device being configured to provide the decoding functionality. In general, the FEC decoder 30 may comprise circuitry or means 31-35 configured to provide the functionality of the FEC decoder 30. For example, the circuitry or means 31-35 may be implemented using application-specific circuitry, using a digital signal processor, or using a programmable hardware component, such as a processor. For example, as shown in FIGS. 3c to 3f, the FEC decoder 30 may comprise LDPC decoder circuitry 31 and output circuitry (or hard-decision circuitry) 32. Correspondingly, the FEC decoder 30 may comprise means 31 for performing LDPC decoding and output means (or hard-decision means) 32. Optionally, the FEC decoder may comprise further circuitry or means, e.g., circuitry or means 34; 35 for swapping LLR or binary values. As shown in FIGS. 3c to 3f, the FEC encoder 20 may further comprise interconnects for internally connecting the circuitry or means of the FEC, and switching circuitry for selectively applying signals to the circuitry and/or means. For example, the switches may be controlled based on a soft/hard input signal 33. As shown in FIGS. 3c to 3f, the OLT 300 (and/or the ONU 200) may comprise LLR calculation circuitry/means for LLC calculation 307. Additionally, referring to FIGS. 1b and 1c, the OLT 300 may comprise an avalanche photo diode (APD) 301, a transimpedance amplifier (TIA) 302, a limiting amplifier (LA) 303 and a clock-data recovery block 304, and/or comprise an avalanche photo diode (APD) 301, a transimpedance amplifier (TIA), an automatic gain control (AGC) 305 and an analog-to-digital converter (ADC) 306.

The proposed FEC decoder 30 is suitable for use with hard-decision input at a receiver and for use with soft-decision input at the receiver. In other words, the decoder 30 is suitable for decoding an input signal being based on soft-decision input and suitable for decoding an input signal being based on hard-decision input. However, in both cases, the input signal is obtained as LLR (Log-Likelihood Ratio) values, i.e., values that are expressed as Log-Likelihood-Ratios. If the input signal is based on soft-decision input, the LLR values may represent the soft-decision input. If the input signal is based on hard-decision input, i.e., binary input, the LLR values, two pre-defined LLR values may be used to represent the 0's and the 1's of the hard-decision input. As shown in FIGS. 1b and 1c, and further shown in FIGS. 3a, 3c to 3f, the LLR values may be provided by LLR calculation circuitry 307, which may be configured to provide the LLR values based on the input signal. For example, the ONU 300, and/or the OLT 200, may comprise the LLR calculation circuitry 307.

The FEC decoder, e.g., the LDPC decoder circuitry 31, is configured to decode the input signal using LDPC iterative decoding that is based on an LDPC code. As outlined above, in general, an LDPC decoder, such as the LDPC decoder 31, takes an LDPC codeword as an input, and uses a so-called parity-check matrix (also called H matrix) to calculate a syndrome of the codeword (using a matrix multiplication). In general, an LDPC code is characterized by its parity-check matrix H. As the name suggests, the parity-check matrix H may be used to check an LDPC codeword x for validity. The syndrome indicates whether the codeword is correct—if the syndrome is 0 (i.e., all bits of the logical syndrome are logical 0) the codeword is correct. If not, or rather as long as this is not the case (and a maximal number of iterations has not been reached), an iterative process involving message passing is used to correct the code word, by passing "messages" between the variable bit nodes (of the codeword) and the so-called check nodes (of the syndrome) according to a decoder algorithm. For example, the LDPC decoder 31 may be configured to perform LDPC iterative decoding, using e.g., the min-sum or the sum-product method. The decoder takes the input (i.e., the LDPC codeword) as LLR values $l_{in}=[l_{in,1}, \ldots, l_{in,N}]$. The input LLR values may be derived from the input signal for the transmitted bits. For punctured bits, they may be set to 0 and for shortened bits, the input LLR values may be set to the maximum LLR value. In each iteration, the decoder may yield output LLR values $l_{out}$ and the binary output $\hat{x}$ may be derived from the LLR output as $$\hat{x}_i = \begin{cases} 1 \text{ for } l_{out,i} < 0 \\ 0 \text{ for } l_{out,i} \geq 0 \end{cases}$$

The iterations may be stopped when the parity check equation $H \cdot \hat{x}=0$ is satisfied or when the maximum number of iterations is reached. The binary output $\hat{u}$ may be the subset of 2 which corresponds to the data (i.e., payload) bits.

Similar to the encoding process laid out in connection with FIGS. 2a to 2f, the decoding process is also based on using one or two LDPC codes. In other words, the input signal is decoded using a single LDPC code that is suitable for use with soft-decision input and hard-decision input at the receiver or using one of two LDPC codes that are suitable for soft-decision input and hard-decision input, respectively.

Figure 3C:
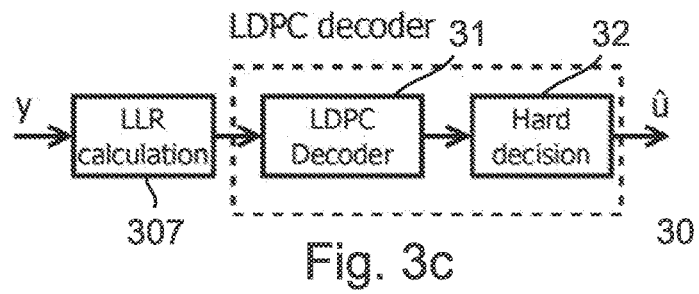
FIG. 3c shows a schematic diagram of an example of a low-density parity-check code decoder using one low-density parity-check code for hard and soft input.

For example, the input signal may be decoded using the same LDPC code with hard-decision input at the receiver and with soft-decision input at the receiver. In other words, the FEC decoder may be configured to use the same LDPC code, and thus also the same decoding circuitry, to decode the input signal regardless the input signal being based on soft-decision input or hard-decision input. For example, as outlined in connection with FIGS. 2a to 2f, the input signal may be decoded using a single LDPC code where performance is balanced for good performance with hard-decision input and soft-decision input. In this case, the FEC decoder may operate the same way with the input signal being based on soft-decision input and the input signal being based on hard-decision input. In this example, where the same code is used for hard and soft-decision input, the LDPC decoder behavior might not change between soft and hard-decision input. FIG. 3c shows a schematic diagram of an example of a low-density parity-check code decoder using one low-density parity-check code for hard and soft input. In FIG. 3c, the signal y is provided to the LLR calculation block 307, which provides the LLR values to the LDPC decoder 31, which performs the LDPC iterative decoding. Once the LDPC decoder has finished the iterative decoding process, the output of the LDPC decoder 31 may be provided, as LLR values, to the Hard-decision block 32, which may be used to convert the LLR values to binary values, and to output the binary output û.

Alternatively, the same LDPC code may be used, but different sets of bits may be used for shortening/puncturing. In other words, the input signal may be decoded using a single LDPC code (i.e., the same for soft-decision input and hard-decision input), using a first set of puncturing bits and/or a first set of shortening bits with soft-decision input at the receiver and second set of puncturing bits and/or a second set of shortening bits with hard-decision input at the receiver. In other words, the FEC decoder, or the LLR calculation circuitry, may be configured to account for shortening and/or puncturing using a first set of puncturing bits and/or a first set of shortening bits for use with soft-decision input at the receiver and to account for shortening and/or puncturing using a second set of puncturing bits and/or a second set of shortening bits for use with hard-decision input at the receiver. For example, the first and second set of shortening bits may be disjoint, and the first and second set of puncturing bits may be disjoint. In other words, a single LDPC code may be used that uses different puncturing and/or shortening pattern (and/or number of puncturing/shortening bits) when working with soft-decision input or working with hard-decision input. For example, the use of the different puncturing and/or shortening pattern may be implemented at the LLR calculation circuitry before the LDPC codeword reaches the LDPC decoder.

Figure 3D:
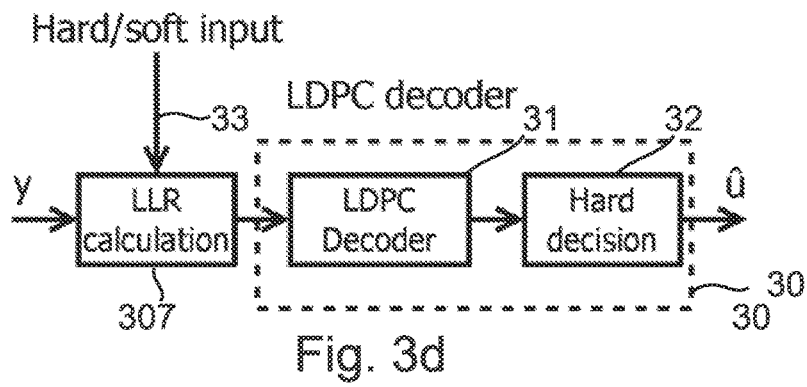
FIG. 3d shows a schematic diagram of an example of a low-density parity-check code decoder using different puncturing/shortening for hard and soft input, which is inserted in a log-likelihood-ratio block.

In the example shown in FIG. 3c, the same LDPC code is used with a different puncturing and/or shortening pattern. As shown in FIG. 3d, the LLR calculation block 307, which derives the LLR values from the received signal y and inserts the $l_i=0$ values for punctured bits or the $l_i=l_{max}$ max values for shortened bits, may perform this operation differently for soft and hard input, based on a hard/soft input signal 33. FIG. 3d shows a schematic diagram of an example of a low-density parity-check code decoder using different puncturing/shortening for hard and soft input, which is inserted in the log-likelihood-ratio block 307.

Figure 3E:
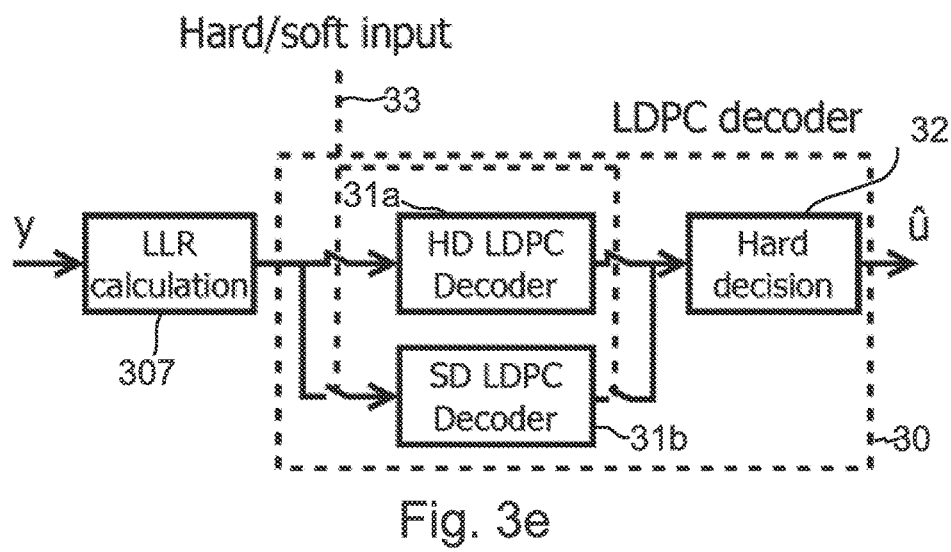
FIG. 3e shows a schematic diagram of an example of a low-density parity-check code decoder switching between different low-density parity-check codes for hard and soft input.

Alternatively, as outlined above, the input signal may be decoded using two LDPC codes. For example, one of the LDPC codes may be used for use with soft-decision input at the receiver and the other LDPC code may be used for use with hard-decision input at the receiver. In this case, the input signal, and thus the LDPC codeword, may be decoded based on different LDPC codes, depending on whether the input signal is based on soft-decision input or whether the input signal is based on hard-decision input Accordingly, one of the LDPC codes may be optimized for hard-decision input and the other LDPC code may be optimized for soft-decision input. Again, there are (at least) two options— two entirely separate LDPC codes may be used, or one of the LDPC codes may be derived from the other. In other words, the LDPC code being used to decode an input signal being based on soft-decision input may be independent from the LDPC code being used to decode an input signal being based on hard-decision input. In this case, the FEC decoder may comprise two sets of decoder circuitry, one for decoding an input signal that is based on soft-decision input, and the other for decoding an input signal that is based hard-decision input. In this case, different decoders 31a; 31b may be used, with one of the decoders being used for input signals being based on soft-decision input, and the other being used for input signals being based on hard-decision input. FIG. 3e shows a schematic diagram of an example of a low-density parity-check code decoder switching between different low-density parity-check codes for hard and soft input. Again, the hard/soft input signal 33 is used to switch between the two decoders 31a; 31b, depending on whether the input signal is based on soft-decision input or based on hard-decision input.

Figure 3F:
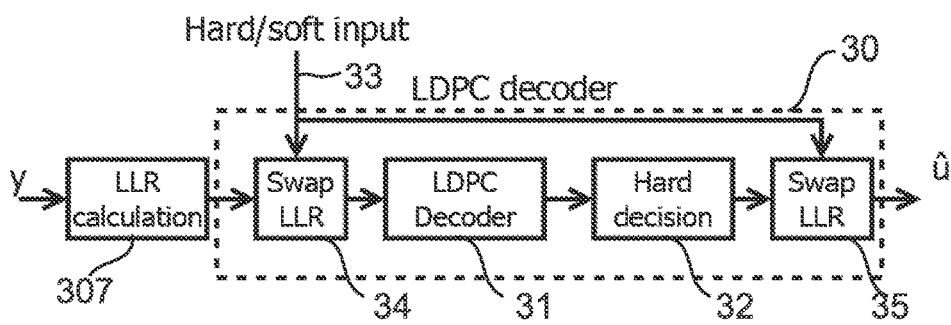
FIG. 3f shows a schematic diagram of an example of a low-density parity-check code decoder where input log-likelihood-ratio and output bit order is changed for soft and hard-decision input.

Alternatively, one of the LDPC codes may be derived from each other, so that major portions of the decoder circuitry can be used for decoding an input signal that is based on soft-decision input and for decoding an input signal that is based on hard-decision input. For example, one of the LDPC codes may be derived from the other LDPC code via one or more matrix operations. For example, two LDPC codes may be used, one optimized for soft-decision input and one optimized for hard-decision input where one matrix is derived from the other matrix by simple matrix operations and that can be performed outside of the decoder itself. For example, the LDPC code being used with soft-decision input is derived from the LDPC code being used with hard-decision input via an exchange of columns of a parity matrix of the LDPC code being used for use with hard-decision input. In other words, by an exchange of columns in the parity-check matrix, the soft-decision matrix may be derived from the hard-decision-optimized matrix, by using one decoder hardware and exchanging the LLR values (according to the exchanged columns in the parity-check matrix) at the input of the LDPC decoder, or by another exchange of the LLR values or the hard-decision output at the output of the LDPC decoder (according to the exchanged columns in the parity-check matrix). For example, the FEC decoder may be configured to change the order of the LLR values according to the exchange of columns when decoding soft-decision input. The FEC decoder may be configured to change the order of the LLR values representing the input signal before providing the LLR values to the LDPC decoder circuitry, and to change the order back after LDPC iterative decoding. This is shown in FIG. 3f, which shows a schematic diagram of an example of a low-density parity-check code decoder where input log-likelihood-ratio and output bit order is changed for soft and hard-decision input.

For this example, where columns are changed between soft and hard-decision input operation, the decoder itself may remain the same for hard and soft-decision input. As shown in FIG. 3f, in an additional pre-processing and post-processing stage, the input LLR positions and output bit positions may be changed for soft or hard-decision mode. In the LDPC decoder 30 of FIG. 3f, the LLR values are fed into a Swap LLR block 34 before feeding them into the LDPC decoder 31 and to the Hard-decision block 32, before being fed into another Swap LLR block 35. Contrary to nomenclature, as the output of the Hard-decision block 32 is binary values, the Swap LLR block 35 is used to swap the binary values output by the Hard-decision block 32.

At the input this means that the soft input LLR may be re-arranged according to $l_{in,S}=[l_{in,N-P+1}, \ldots l_{in,N} l_{in,P+1}, \ldots l_{in,N-P} l_{in,1}, \ldots, l_{in,P}]$. At the output, this may be done again $\hat{x}_S=[\hat{x}_{N-P+1}, \ldots, \hat{x}_N \hat{x}_{P+1}, \ldots, \hat{x}_{N-P} \hat{x}_1, \ldots \hat{x}_P]$ to get the correct bit order at the output.

More details and aspects of the FEC decoder or ONU are mentioned in connection with the proposed concept or one or more examples described above or below (e.g., FIG. 1a to 2f, 4a to 4d). The FEC decoder or the ONU may comprise one or more additional optional features corresponding to one or more aspects of the proposed concept or one or more examples described above or below.

As outlined above, the PON transmission system may support multiple LDPC code options, depending on transmission speed and receiver architecture. In some PON, the transmission speed may be strictly coupled to the wavelength used and the FEC may be fixed for a certain transmission speed/wavelength. For the FEC encoding/decoding scheme described in connection with FIGS. 1a to 3f, the selection of the LDPC code options depending on the transmission speed/wavelength may also be used. For example, the hard-decision encoder/decoder may always be used in the 25G mode and the soft-decision encoder/decoder may always be used in 50G mode.

But depending on the receiver architecture, it may be beneficial to allow the hard-decision and soft-decision mode for the same transmission speed/wavelength and select the FEC setting based on another criteria.

Figure 4A:
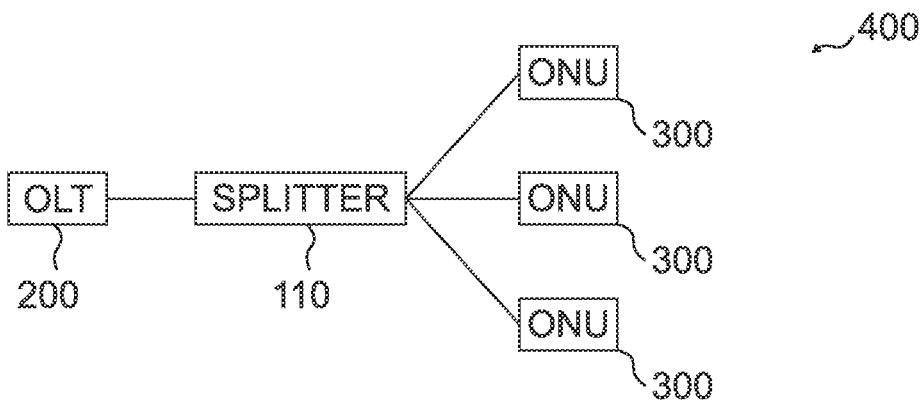
FIG. 4a shows a block diagram of an example of a passive optical network system.

FIG. 4a shows a block diagram of an example of a passive optical network system 400. The PON system 400 comprises an OLT 200 and one or more (e.g., a plurality of) ONUs 300. The PON system 400 supports hard-decision input receivers and soft-decision input receivers with a Forward Error Correction (FEC) encoder (e.g., as shown in FIGS. 2a to 2f) and a FEC decoder (e.g., as shown in FIGS. 3a to 3f) (both) suitable for (e.g. optimized for) a hard-decision input setting and a soft-decision input setting. In other words, the PON system may operate with receivers that support hard-decision input and soft-decision input. Consequently, the FEC decoders employed by the receivers may support decoding soft-decision input and hard-decision input, and the transmitter transmitting the signals being decoded by the FEC decoders may support generating FEC data for use with soft-decision input and FEC data for use with hard-decision input. For example, the ONUs may comprise such receivers and the OLT may comprise the transmitter. On the other hand, signals might not only be sent from the OLT to the ONUs, but also from the ONUs to the OLT. Consequently, the OLT may comprise such a receiver, and the one or more ONUs may comprise such transmitters. For example, the receivers, e.g., of the one or more ONUs 300 and, optionally, of the OLT 200, may be suitable for decoding hard-decision input and soft-decision input. On the other hand, the transmitters, e.g., of the OLT 200 and, optionally, of the one or more ONUs 300, may be suitable for generating FEC data for use with soft-decision input and for generating FEC data for use with hard-decision input. The encoder and decoder, e.g., the FEC encoder 20 and the FEC decoder 30, are able to, or configured to, switch 460 between the hard-decision input setting and the soft-decision input setting. In other words, the encoder is capable of generating FEC data for use with soft-decision input and FEC data for use with hard-decision input, and able to, or configured to switch between generating FEC data for use with soft-decision input and generating FEC data for use with hard-decision input. Correspondingly, the decoder is capable of decoding soft-decision input and capable of decoding hard-decision input, and able to, or configured to, switch between decoding hard-decision input and decoding soft-decision input. If the soft-decision input and hard-decision input is decoded based on the same LDPC code, no switch might be necessary at the decoder and at the encoder.

FIG. 4a further shows the OLT 200 that is suitable for the PON system 400 that supports hard-decision input receivers and soft-decision input receivers with a Forward Error FEC encoder and a FEC decoder suitable for (e.g. optimized for) a hard-decision input setting and a soft-decision input setting, the encoder and decoder being able to, or configured to, switch between the hard-decision input setting and the soft-decision input setting. FIG. 4a further shows one or more ONUs 300 that are suitable for the PON system 400 that supports hard-decision input receivers and soft-decision input receivers with a FEC encoder and a FEC decoder suitable for (e.g. optimized for) a hard-decision input setting and a soft-decision input setting, the encoder and decoder being able to, or configured to, switch between the hard-decision input setting and the soft-decision input setting. For example, the encoders and decoders used in the PON system 400, e.g., by the OLT 200 and the one or more ONUs 300, may correspond to the FEC encoder 20 and FEC decoder 30 introduced in connection with FIGS. 2a to 3f.

Figure 4B:
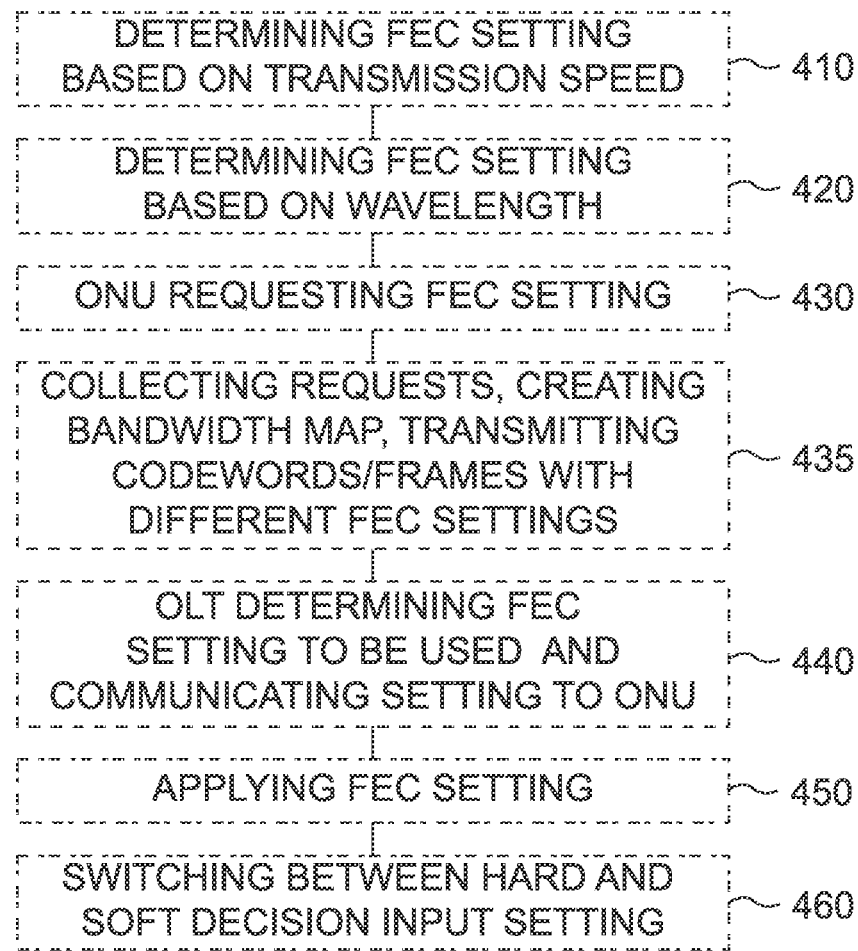
FIG. 4b shows a flow chart of an example of methods for an optical line terminal and for an optical networking unit of a passive optical network.

FIG. 4b shows a flow chart of an example of corresponding methods for an optical line terminal and for an optical networking unit of a passive optical network. The method for the OLT 200 comprises switching 460 the encoder and decoder between the hard-decision input setting and the soft-decision input setting. The method for the ONU 300 likewise comprises switching 460 the encoder and decoder between the hard-decision input setting and the soft-decision input setting.

As outlined above, the encoders and decoders being used in the PON system 400, e.g., by the OLT 200 and the one or more ONUs 300, are able to operate using a hard-decision input setting and using a soft-decision input setting. In some cases, the use of the hard-decision input setting or of the soft-decision input setting depends on the transmission speed and/or wavelength being used. In other words, the use of the hard-decision input setting (e.g., hard input FEC setting) and the soft-decision input FEC setting (e.g., soft input FEC setting) may be determined 410 by the transmission speed used. For example, if or when the PON system 400 operates at a transmission speed of 25 Gbit/s, the hard-decision input setting may be used, and at a transmission speed of 50 Gbit/s or 100 Gbit/s, the soft-decision input setting may be used. Alternatively or additionally, the use of the hard-decision input setting (e.g., hard input FEC setting) and the soft-decision input setting (e.g., soft input FEC setting) may be determined 420 by the wavelength used. For example, if a first wavelength or first wavelength band is used, the hard-decision input setting may be used, and if a second wavelength or second wavelength band is used, the soft-decision input setting may be used.

In some examples, the FEC setting to be used is determined/defined by the OLT and communicated to the ONUs in an overhead channel, e.g., the OC (Optical Coding) structure that is part of the header of each transmission frame. In this context, the FEC setting may define whether the hard-decision input setting or the soft-decision input setting is used. For example, the FEC setting to be used may be determined 440 by the OLT and communicated to the ONUs in an overhead channel (e.g., a logical channel for transmitting control information, which may be part of a header of the respective frames). Correspondingly, the OLT may be configured to determine 440 the FEC setting to be used and to communicate the FEC setting to be used to the one or more Optical ONUs of the PON system in the overhead channel. The ONU, or the one or more ONUs, may be configured to receive the FEC setting to be used from the of the PON system in the overhead channel. The overhead channel may be protected by an FEC that is more robust and can be received reliably with both types of receivers. This may be achieved by a different FEC or by using a predefined LDPC setting (either the soft input or the hard input one), but with additional protection through a reduced code rate (by reduced puncturing P or additional shortening S) to increase the likelihood of correctly receiving it in any case.

Figure 4C:
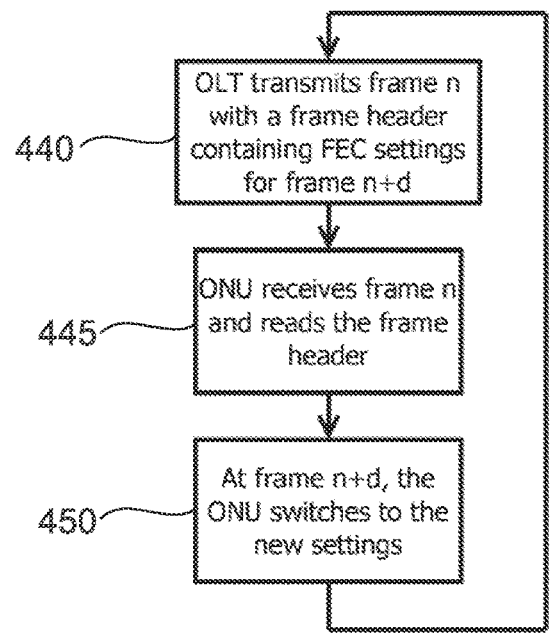
FIG. 4c shows a schematic diagram of an example of control actions for a passive optical network system which allows multiple forward error correction settings at the same wavelength with control by the optical networking unit.

In some examples, the new FEC setting may be applied immediately, e.g., in the frame or codeword received immediately after the frame or codeword comprising the updated setting. In other words, a change of settings may be applied 450 immediately after the setting is communicated. In some examples, the communication may be done a certain number of codewords or frames in advance to account for pipeline delays in the receiver. In other words, the change of settings may be communicated in advance and applied 450 a predefined number (e.g., a certain number) of codewords or frames later. FIG. 4c shows a schematic diagram of an example of control actions for a passive optical network system which allows multiple forward error correction settings at the same wavelength with control by the optical networking unit. For example, as shown in FIG. 4c, the FEC setting communicated in frame n may apply from frame n+d onwards. The OLT may transmit 440 frame n with a frame header containing FEC settings for frame n+d onwards. The ONU may receive 445 the frame n and read the frame header. At frame n+d, the ONU may switch 450; 460 to the new settings. In some examples, the changes are applied only when multiple messages with the same, new setting are received to avoid switching due to sporadic transmission errors.

In some examples, different ONUs may communicate at different transmission speeds, e.g., due to the physical properties of the optical connection between the OLT and the respective ONUs. Properties of the connection, such as the transmission speed, wavelength (band) or the FEC setting that is suitable for an ONU may be determined during "training" of the respective ONU, i.e., during a phase during which the optical connection is tested before the connection between the OLT and the respective ONU is fully established. Alternatively or additionally, some receivers may support only a subset of the FEC settings, e.g., only soft-decision decoding, only hard-decision decoding, or only a certain puncturing/shortening pattern. During the training, the one or more ONUs may request a FEC setting (or transmission speed/wavelength (band), which is then linked to a FEC setting) from the OLT. In other words, the FEC setting may be requested 430 by the ONUs during training.

The ONU, or one or more ONUs, may be configured to provide 430 a request regarding the FEC setting to be used to the OLT of the PON system during training of the ONU. An example of this approach is shown in FIG. 4d.

Figure 4D:
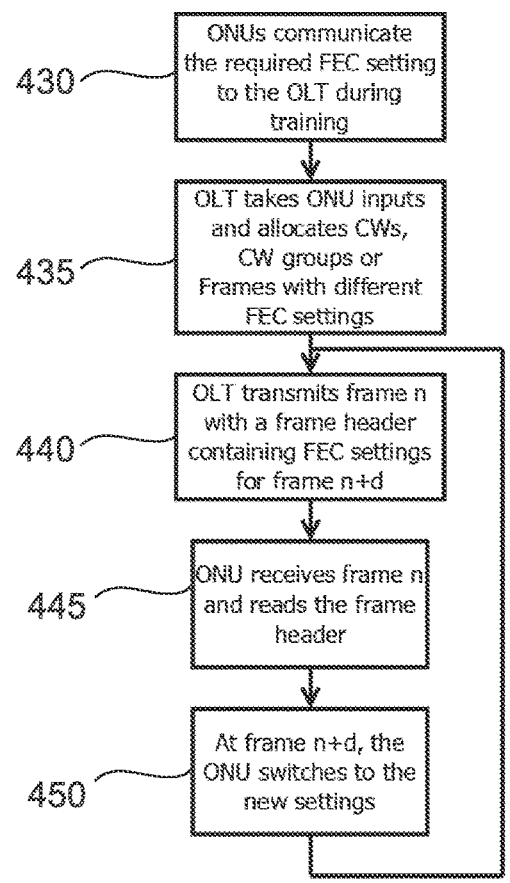
FIG. 4d shows a schematic diagram of an example of control actions for a passive optical network system which allows multiple forward error correction settings at the same wavelength with control inputs from the optical networking units.

FIG. 4d shows a schematic diagram of an example of control actions for a passive optical network system which allows multiple forward error correction settings at the same wavelength with control inputs from the optical networking units. In the example shown in FIG. 4d, the ONU receivers may request a certain type of FEC setting, depending on the receiver architecture. This may be communicated 430 from the ONUs to the OLT in the registration process that takes place before the regular transmission starts. Based on the setting communicated by the ONUs, the OLT may generate groups of ONUs which request the same FEC setting. Downstream transmission may be grouped 435 into FEC codewords, groups of FEC codewords with the same FEC setting within a frame, or frames which use the same FEC setting for the complete frame. The individual ONUs may receive a bandwidth map in advance which gives information for the codewords, groups of codewords or frames which use the FEC setting for a certain ONU with the requested FEC setting. In other words, the OLT may collect 435 the requests, create a bandwidth map for transmissions with different FEC settings, and transmits codewords, groups of codewords (e.g., interleaved within the FEC frame) or frames with different FEC settings. In other words, frames transmitted by the OLT may comprise codewords having different FEC settings, or different frames transmitted by the OLT may have different OLT settings. Consequently, the communication between and OLT and ONUs may be performed at the optimal transmission speed for each of the ONUs, instead of falling back to the highest common denominator. The OLT may be configured to receive 435 requests regarding the FEC setting to be used from the one or more ONUs of the PON system, to collect the requests, to create a bandwidth map for transmissions with different FEC settings, and to transmit codewords, groups of codewords or frames with different FEC settings. Similar to FIG. 4c, the OLT may transmit 440 frame n with a frame header containing FEC settings for frame n+d onwards. The ONU may receive 445 the frame n and read the frame header. At frame n+d, the ONU may switch 450; 460 to the new settings.

More details and aspects of the passive optical network are mentioned in connection with the proposed concept or one or more examples described above or below (e.g., FIG. 1a to 3f). The passive optical network may comprise one or more additional optional features corresponding to one or more aspects of the proposed concept or one or more examples described above or below.

Example 1 relates to a forward-error-correction (FEC) encoder (20) that is suitable for generating FEC data for use with hard-decision input at a receiver and for use with soft-decision input at the receiver, wherein the encoder is configured to generate the FEC data based on payload bits using a Low-Density Parity-Check (LDPC) code, wherein the generated FEC data is generated using a single LDPC code that is suitable for use with soft-decision input and hard-decision input at the receiver or using one of two LDPC codes that are suitable for soft-decision input and hard-decision input, respectively.

In Example 2, the subject matter of example 1 or any of the Examples described herein may further include, that the FEC data is generated using the same LDPC code for use with hard-decision input at the receiver and for use with soft-decision input at the receiver.

In Example 3, the subject matter of example 2 or any of the Examples described herein may further include, that the FEC data is generated with a single LDPC code where performance is balanced for good performance with hard-decision input and soft-decision input.

In Example 4, the subject matter of example 2 or any of the Examples described herein may further include, that the FEC data is generated using a single LDPC code that uses a first set of puncturing bits and/or a first set of shortening bits for use with soft-decision input at the receiver and second set of puncturing bits and/or a second set of shortening bits for use with hard-decision input at the receiver.

In Example 5, the subject matter of example 1 or any of the Examples described herein may further include, that the FEC data is generated using two LDPC codes, one of the LDPC codes being used for use with soft-decision input at the receiver and the other LDPC code being used for use with hard-decision input at the receiver.

In Example 6, the subject matter of example 5 or any of the Examples described herein may further include, that one of the LDPC codes is optimized for hard-decision input and the other LDPC code is optimized for soft-decision input.

In Example 7, the subject matter of one of the examples 5 to 6 or any of the Examples described herein may further include, that one of the LDPC codes is derived from the other LDPC code via one or more matrix operations.

In Example 8, the subject matter of example 7 or any of the Examples described herein may further include, that the LDPC code being used for use with soft-decision input is derived from the LDPC code being used for use with hard-decision input via an exchange of columns of a parity matrix of the LDPC code being used for use with hard-decision input.

In Example 9, the subject matter of example 8 or any of the Examples described herein may further include, that the FEC encoder is configured to generate the FEC data by multiplying, segment-wise, the payload bits with a first matrix and with a second matrix, wherein columns of the first and/or second matrix being used to generate FEC data for use with hard-decision input and soft-decision input are multiplied using shared circuitry, and wherein the remaining columns of the first and/or second matrix are multiplied using circuitry that is switched according to the use of soft-decision input or hard-decision input.

Example 10 relates to a forward-error-correction (FEC) decoder (30) that is suitable for use with hard-decision input at a receiver and for use with soft-decision input at the receiver, wherein the decoder is configured to obtain an input signal as LLR values. The forward-error-correction (FEC) decoder (30) is configured to decode the input signal using Low-Density Parity-Check (LDPC) iterative decoding that is based on an LDPC code, wherein the input signal is decoded using a single LDPC code that is suitable for use with soft-decision input and hard-decision input at the receiver or using one of two LDPC codes that are suitable for soft-decision input and hard-decision input, respectively.

In Example 11, the subject matter of example 10 or any of the Examples described herein may further include, that the input signal is decoded using the same LDPC code with hard-decision input at the receiver and with soft-decision input at the receiver.

In Example 12, the subject matter of example 11 or any of the Examples described herein may further include, that the input signal is decoded using a single LDPC code where performance is balanced for good performance with hard-decision input and soft-decision input.

In Example 13, the subject matter of example 11 or any of the Examples described herein may further include, that the input signal is decoded using a single LDPC code that uses a first set of puncturing bits and/or a first set of shortening bits with soft-decision input at the receiver and a second set of puncturing bits and/or a second set of shortening bits with hard-decision input at the receiver.

In Example 14, the subject matter of example 10 or any of the Examples described herein may further include, that the input signal is decoded using two LDPC codes, one of the LDPC codes being used with soft-decision input at the receiver and the other LDPC code being used with hard-decision input at the receiver.

In Example 15, the subject matter of example 14 or any of the Examples described herein may further include, that one of the LDPC codes is optimized for hard-decision input and the other LDPC code is optimized for soft-decision input.

In Example 16, the subject matter of one of the examples 14 to 15 or any of the Examples described herein may further include, that one of the LDPC codes is derived from the other LDPC code via one or more matrix operations.

In Example 17, the subject matter of example 16 or any of the Examples described herein may further include, that the LDPC code being used with soft-decision input is derived from the LDPC code being used with hard-decision input via an exchange of columns of a parity matrix of the LDPC code being used for use with hard-decision input.

In Example 18, the subject matter of example 17 or any of the Examples described herein may further include, that the FEC decoder is configured to change the order of the LLR values according to the exchange of columns when decoding soft-decision input.

Example 19 relates to a Passive Optical Network (PON) system (100; 400) that supports hard-decision input receivers and soft-decision input receivers with a Forward Error Correction (FEC) encoder (20) and a FEC decoder (30) suitable for (e.g. optimized for) a hard-decision input setting and a soft-decision input setting, the encoder and decoder being able to switch between the hard-decision input setting and the soft-decision input setting.

In Example 20, the subject matter of example 19 or any of the Examples described herein may further include, that the use of the hard-decision input setting and the soft-decision input setting is determined by the transmission speed used.

In Example 21, the subject matter of example 19 or any of the Examples described herein may further include, that the use of the hard-decision input setting and the soft-decision input setting is determined by the wavelength used.

In Example 22, the subject matter of example 19 or any of the Examples described herein may further include, that the PON system comprises an Optical Line Terminal (OLT) and Optical Network Units (ONUs), wherein the FEC setting to be used is determined by the OLT and communicated to the ONUs in an overhead channel.

In Example 23, the subject matter of example 22 or any of the Examples described herein may further include, that a change of settings is applied immediately after the setting is communicated.

In Example 24, the subject matter of example 22 or any of the Examples described herein may further include, that the change of settings is communicated in advance and applied a pre-defined number of codewords or frames later.

In Example 25, the subject matter of one of the examples 19 to 24 or any of the Examples described herein may further include, that the PON system comprises an Optical Line Terminal (OLT) (200) and Optical Network Units (ONUs) (300), wherein the FEC setting is requested by the ONUs during training.

In Example 26, the subject matter of example 25 or any of the Examples described herein may further include, that the OLT collects the requests, creates a bandwidth map for transmissions with different FEC settings, and transmits codewords, groups of codewords or frames with different FEC settings.

Example 27 relates to an Optical Line Terminal (OLT) (300) for a Passive Optical Network (PON) (100; 400) that supports hard-decision input receivers and soft-decision input receivers with a Forward Error Correction (FEC) encoder (20) and a FEC decoder (30) suitable for (e.g. optimized for) a hard-decision input setting and a soft-decision input setting, the encoder and decoder being able to switch between the hard-decision input setting and the soft-decision input setting.

In Example 28, the subject matter of example 27 or any of the Examples described herein may further include, that the use of the hard-decision input setting and the soft-decision input setting is determined by the transmission speed used.

In Example 29, the subject matter of example 27 or any of the Examples described herein may further include, that the use of the hard-decision input setting and the soft-decision input setting is determined by the wavelength used.

In Example 30, the subject matter of example 27 or any of the Examples described herein may further include, that the OLT is configured to determine the FEC setting to be used and to communicate the FEC setting to be used to Optical Networking Units (ONUs) (300) of the PON system in an overhead channel.

In Example 31, the subject matter of example 30 or any of the Examples described herein may further include, that a change of settings is applied immediately after the setting is communicated.

In Example 32, the subject matter of example 30 or any of the Examples described herein may further include, that the change of settings is communicated in advance and applied a pre-defined number of codewords or frames later.

In Example 33, the subject matter of one of the examples 30 to 32 or any of the Examples described herein may further include, that the OLT is configured to receive requests regarding the FEC setting to be used from Optical Networking Units (ONUs) (300) of the PON system, to collect the requests, to create a bandwidth map for transmissions with different FEC settings, and to transmit codewords, groups of codewords or frames with different FEC settings.

Example 34 relates to an Optical Networking Unit (ONU) (300) for a Passive Optical Network (PON) (100; 400) that supports hard-decision input receivers and soft-decision input receivers with a Forward Error Correction (FEC) encoder (20) and a FEC decoder (30) suitable for (e.g. optimized for) a hard-decision input setting and a soft-decision input setting, the encoder and decoder being able to switch between the hard-decision input setting and the soft-decision input setting.

In Example 35, the subject matter of example 34 or any of the Examples described herein may further include, that the use of the hard-decision input setting and the soft-decision input setting is determined by the transmission speed used.

In Example 36, the subject matter of example 34 or any of the Examples described herein may further include, that the use of the hard-decision input setting and the soft-decision input setting is determined by the wavelength used.

In Example 37, the subject matter of example 34 or any of the Examples described herein may further include, that the ONU is configured to receive the FEC setting to be used from an Optical Line Terminal (200) of the PON system in an overhead channel.

In Example 38, the subject matter of example 37 or any of the Examples described herein may further include, that a change of settings is applied immediately after the setting is communicated.

In Example 39, the subject matter of example 37 or any of the Examples described herein may further include, that the change of settings is communicated in advance and applied a pre-defined number of codewords or frames later.

In Example 40, the subject matter of one of the examples 34 to 39 or any of the Examples described herein may further include, that the ONU is configured to provide a request regarding the FEC setting to be used to an Optical Line Terminal (OLT) (200) of the PON system during training of the ONU.

Example 41 relates to an Optical Line Terminal (OLT) (200) comprising the Forward Error Correction (FEC) encoder (20) according to one of the examples 1 to 9.

In Example 42, the subject matter of one of the examples 10 to 18 or any of the Examples described herein may further include, that the OLT further comprises the FEC decoder (30) according to one of the examples 10 to 18.

In Example 43, the subject matter of one of the examples 41 to 42 or any of the Examples described herein may further include, that the OLT is the OLT according to one of the examples 27 to 33.

Example 44 relates to an Optical Networking Unit (ONU) (300) comprising the Forward Error Correction (FEC) decoder (30) according to one of the examples 10 to 18.

In Example 45, the subject matter of one of the examples 1 to 18 or any of the Examples described herein may further include, that the ONU further comprises the FEC encoder (20) according to one of the examples 1 to 9.

In Example 46, the subject matter of one of the examples 44 to 45 or any of the Examples described herein may further include, that the ONU is the ONU according to one of the examples 34 to 40.

Example 47 relates to a forward-error-correction (FEC) encoding method that is suitable for generating FEC data for use with hard-decision input at a receiver and for use with soft-decision input at the receiver, wherein the encoding method comprises Generating (210) the FEC data based on payload bits using a Low-Density Parity-Check (LDPC) code, wherein the generated FEC data is generated using a single LDPC code that is suitable for use with soft-decision input and hard-decision input at the receiver or using one of two LDPC codes that are suitable for soft-decision input and hard-decision input, respectively.

In Example 48, the subject matter of example 47 or any of the Examples described herein may further include, that the FEC data is generated using the same LDPC code for use with hard-decision input at the receiver and for use with soft-decision input at the receiver.

In Example 49, the subject matter of example 48 or any of the Examples described herein may further include, that the FEC data is generated with a single LDPC code where performance is balanced for good performance with hard-decision input and soft-decision input.

In Example 50, the subject matter of example 48 or any of the Examples described herein may further include, that the FEC data is generated using a single LDPC code that uses a first set of puncturing bits and/or a first set of shortening bits for use with soft-decision input at the receiver and second set of puncturing bits and/or a second set of shortening bits for use with hard-decision input at the receiver.

In Example 51, the subject matter of example 48 or any of the Examples described herein may further include, that the FEC data is generated using two LDPC codes, one of the LDPC codes being used for use with soft-decision input at the receiver and the other LDPC code being used for use with hard-decision input at the receiver.

In Example 52, the subject matter of example 51 or any of the Examples described herein may further include, that one of the LDPC codes is optimized for hard-decision input and the other LDPC code is optimized for soft-decision input.

In Example 53, the subject matter of one of the examples 51 to 52 or any of the Examples described herein may further include, that one of the LDPC codes is derived from the other LDPC code via one or more matrix operations.

In Example 54, the subject matter of example 53 or any of the Examples described herein may further include, that the LDPC code being used for use with soft-decision input is derived from the LDPC code being used for use with hard-decision input via an exchange of columns of a parity matrix of the LDPC code being used for use with hard-decision input.

In Example 55, the subject matter of example 54 or any of the Examples described herein may further include, that the FEC encoding method comprises generating the FEC data by multiplying, segment-wise, the payload bits with a first matrix and with a second matrix, wherein columns of the first and/or second matrix being used to generate FEC data for use with hard-decision input and soft-decision input are multiplied using shared circuitry, and wherein the remaining columns of the first and/or second matrix are multiplied using circuitry that is switched according to the use of soft-decision input or hard-decision input.

Example 56 relates to a forward-error-correction (FEC) decoding method that is suitable for use with hard-decision input at a receiver and for use with soft-decision input at the receiver, wherein the decoding method comprises Obtaining (310) an input signal as LLR values. The forward-error-correction (FEC) decoding method comprises Decoding (330) the input signal using Low-Density Parity-Check (LDPC) iterative decoding that is based on an LDPC code, wherein the input signal is decoded using a single LDPC code that is suitable for use with soft-decision input and hard-decision input at the receiver or using one of two LDPC codes that are suitable for soft-decision input and hard-decision input, respectively.

In Example 57, the subject matter of example 56 or any of the Examples described herein may further include, that the input signal is decoded using the same LDPC code with hard-decision input at the receiver and with soft-decision input at the receiver.

In Example 58, the subject matter of example 57 or any of the Examples described herein may further include, that the input signal is decoded using a single LDPC code where performance is balanced for good performance with hard-decision input and soft-decision input.

In Example 59, the subject matter of example 57 or any of the Examples described herein may further include, that the input signal is decoded using a single LDPC code that uses a first set of puncturing bits and/or a first set of shortening bits with soft-decision input at the receiver and second set of puncturing bits and/or a second set of shortening bits with hard-decision input at the receiver.

In Example 60, the subject matter of example 56 or any of the Examples described herein may further include, that the input signal is decoded using two LDPC codes, one of the LDPC codes being used with soft-decision input at the receiver and the other LDPC code being used with hard-decision input at the receiver.

In Example 61, the subject matter of example 60 or any of the Examples described herein may further include, that one of the LDPC codes is optimized for hard-decision input and the other LDPC code is optimized for soft-decision input.

In Example 62, the subject matter of one of the examples 60 to 61 or any of the Examples described herein may further include, that one of the LDPC codes is derived from the other LDPC code via one or more matrix operations.

In Example 63, the subject matter of example 62 or any of the Examples described herein may further include, that the LDPC code being used with soft-decision input is derived from the LDPC code being used with hard-decision input via an exchange of columns of a parity matrix of the LDPC code being used for use with hard-decision input.

In Example 64, the subject matter of example 63 or any of the Examples described herein may further include, that the FEC decoding method comprises changing (320; 340) the order of the LLR values according to the exchange of columns when decoding soft-decision input.

Example 65 relates to a method for an Optical Line Terminal (OLT) (200) for a Passive Optical Network (PON) (100; 400) that supports hard-decision input receivers and soft-decision input receivers with a Forward Error Correction (FEC) encoder and a FEC decoder suitable for (e.g. optimized for) a hard-decision input setting and a soft-decision input setting, the method comprising switching (460) the encoder and decoder between the hard-decision input setting and the soft-decision input setting.

In Example 66, the subject matter of example 65 or any of the Examples described herein may further include, that the use of the hard-decision input setting and the soft-decision input setting is determined (410) by the transmission speed used.

In Example 67, the subject matter of example 65 or any of the Examples described herein may further include, that the use of the hard-decision input setting and the soft-decision input setting is determined (420) by the wavelength used.

In Example 68, the subject matter of example 65 or any of the Examples described herein may further include, that the method comprises determining (440) the FEC setting to be used and communicating the FEC setting to be used to Optical Networking Units (ONUs) of the PON system in an overhead channel.

In Example 69, the subject matter of example 68 or any of the Examples described herein may further include, that a change of settings is applied (450) immediately after the setting is communicated.

In Example 70, the subject matter of example 68 or any of the Examples described herein may further include, that the change of settings is communicated in advance and applied (450) a pre-defined number of codewords or frames later.

In Example 71, the subject matter of one of the examples 68 to 70 or any of the Examples described herein may further include, that the method comprises receiving (435) requests regarding the FEC setting to be used from Optical Networking Units (ONUs) of the PON system, collecting the requests, creating a bandwidth map for transmissions with different FEC settings, and transmitting codewords, groups of codewords or frames with different FEC settings.

Example 72 relates to a method for an Optical Networking Unit (ONU) (300) for a Passive Optical Network (PON) (100; 400) that supports hard-decision input receivers and soft-decision input receivers with a Forward Error Correction (FEC) encoder and a FEC decoder suitable for (e.g. optimized for) a hard-decision input setting and a soft-decision input setting, the method comprising switching (460) the encoder and decoder between the hard-decision input setting and the soft-decision input setting.

In Example 73, the subject matter of example 72 or any of the Examples described herein may further include, that the use of the hard-decision input setting and the soft-decision input setting is determined (410) by the transmission speed used.

In Example 74, the subject matter of example 72 or any of the Examples described herein may further include, that the use of the hard-decision input setting and the soft-decision input setting is determined (420) by the wavelength used.

In Example 75, the subject matter of example 72 or any of the Examples described herein may further include, that the method comprises receiving (440) the FEC setting to be used from an Optical Line Terminal of the PON system in an overhead channel.

In Example 76, the subject matter of example 75 or any of the Examples described herein may further include, that a change of settings is applied (450) immediately after the setting is communicated.

In Example 77, the subject matter of example 75 or any of the Examples described herein may further include, that the change of settings is communicated in advance and applied (450) a pre-defined number of codewords or frames later.

In Example 78, the subject matter of one of the examples 75 to 77 or any of the Examples described herein may further include, that the method comprises providing (430) a request regarding the FEC setting to be used to an Optical Line Terminal (OLT) of the PON system during training of the ONU.

Example 79 relates to an Optical Line Terminal (OLT) (200) being configured to perform the Forward Error Correction (FEC) encoding method according to one of the examples 47 to 55.

In Example 80, the subject matter of one of the examples 56 to 64 or any of the Examples described herein may further include, that the OLT is configured to perform the FEC decoding method according to one of the examples 56 to 64.

In Example 81, the subject matter of one of the examples 65 to 71 or any of the Examples described herein may further include, that the OLT is configured to perform the method according to one of the examples 65 to 71.

Example 82 relates to an Optical Networking Unit (ONU) (300) being configured to perform the Forward Error Correction (FEC) decoding method according to one of the examples 56 to 64.

In Example 83, the subject matter of one of the examples 47 to 55 or any of the Examples described herein may further include, that the ONU is configured to perform the FEC encoding method according to one of the examples 47 to 55.

In Example 84, the subject matter of one of the examples 72 to 78 or any of the Examples described herein may further include, that the ONU is configured to perform the method according to one of the examples 72 to 78.

Example 85 relates to a Passive Optical Network (PON) system (100; 400) comprising the Optical Line Terminal (OLT) (200) according to one of the examples 79 to 81 and one or more Optical Networking Units (ONUs) (300) according to one of the examples 82 to 84.

In Example 86, the subject matter of example 85 or any of the Examples described herein may further include, that the PON system supports hard-decision input receivers and soft-decision input receivers with a Forward Error Correction (FEC) encoding method and a FEC decoding method suitable for (e.g. optimized for) a hard-decision input setting and a soft-decision input setting, the encoding method and decoding method being able to switch between the hard-decision input setting and the soft-decision input setting.

Example 87 relates to a Passive Optical Network (PON) system (100; 400) comprising the Optical Line Terminal (OLT) (200) according to one of the examples 41 to 43 and one or more Optical Networking Units (ONUs) (300) according to one of the examples 44 to 46.

In Example 88, the subject matter of example 87 or any of the Examples described herein may further include, that the PON system supports hard-decision input receivers and soft-decision input receivers with a Forward Error Correction (FEC) encoder and a FEC decoder suitable for (e.g. optimized for) a hard-decision input setting and a soft-decision input setting, the encoder and decoder being able to switch between the hard-decision input setting and the soft-decision input setting.

Example 89 relates to a machine-readable storage medium including program code, when executed, to cause a machine to perform at least one of the methods of one of the examples 47 to 55, the method according to one of the examples 56 to 64, the method according to one of the examples 61 to 71, and the method according to one of the examples 72 to 78.

Example 90 relates to a computer program having a program code for performing at least one of the methods of one of the examples 47 to 55, the method according to one of the examples 56 to 64, the method according to one of the examples 61 to 71, and the method according to one of the examples 72 to 78, when the computer program is executed on a computer, a processor, or a programmable hardware component.

Example 91 relates to a machine-readable storage including machine readable instructions, when executed, to implement a method or realize an apparatus as claimed in any pending claim or shown in any example.

An example relates to an FEC encoder which is optimized for hard-decision input at the receiver and one for soft-decision input at the receiver with a single LDPC code where performance is balanced for good performance with hard-decision input and soft-decision input or with a single LDPC code that uses different puncturing and/or shortening pattern (and/or number of puncturing/shortening bits) when working with soft-decision input vs. working with hard-decision input or with two LDPC codes, one optimized for soft-decision input and one optimized for hard-decision input or with two LDPC codes, one optimized for soft-decision input and one optimized for hard-decision input where one matrix is derived from the other matrix by simple matrix operations by an exchange of columns in the parity-check matrix, the soft-decision matrix is derived from the hard-decision-optimized matrix. In the encoder, the LDPC encoder processing is performed in multiple smaller steps multiplication of the payload bits vector with a matrix $H_L$ and multiplication with a matrix $H_R^{-1}$, where the parts which are the same for hard and soft input are shared (e.g., the un-changed columns in $H_L$) while other parts (changed columns in $H_L$ and $H_R^{-1}$) are switched between hard input and soft input operation.

An example relates to an FEC decoder which is optimized for hard-decision input at the receiver and one for soft-decision input at the receiver with a single LDPC code where performance is balanced for good performance with hard-decision input and soft-decision input or with a single LDPC code that uses different puncturing and/or shortening pattern when working with soft-decision or hard-decision, which is performed at the LLR block in advance to the LDPC decoder or with two LDPC codes, one optimized for soft-decision input and one optimized for hard-decision input or with two LDPC codes, one optimized for soft-decision input and one optimized for hard-decision input where one matrix is derived from the other matrix by simple matrix operations and that can be performed outside of the decoder itself for example by an exchange of columns in the parity-check matrix, the soft-decision matrix is derived from the hard-decision-optimized matrix this is implemented by using only one decoder hardware and exchanging the LLR values (according to the exchanged columns in the parity-check matrix) at the input of the LDPC decoder and another exchange of the LLR values or the hard-decision output at the output of the LDPC decoder (according to the exchanged columns in the parity-check matrix).

An example relates to a PON system that supports hard-decision input receivers and soft-decision input receivers with FEC encoder and decoder optimized for a hard input setting and soft input setting that is able to switch between both settings where the use of soft input or hard input FEC setting is determined by the transmission speed used where the use of soft input or hard input FEC setting is determined by the wavelength used where the FEC setting to be used is determined by the OLT and communicated to the ONUs in an overhead channel the change of settings can apply immediately after the setting is communicated or the change of settings is communicated in an advance and applied a certain number of codewords or frames later where the FEC setting is requested by the ONUs during the training the OLT collects all requests and creates a bandwidth map for transmissions with different settings and the OLT transmits codewords, groups of codewords (e.g., interleaved within the FEC frame) or frames with different settings. The OLT communicates the position of the FEC codewords, groups of codewords or frames with a certain setting to the ONUs in advance, e.g., in a bandwidth map for downstream the ONUs receive and decode only the FEC codewords, groups of codewords or frames with the setting they requested.

The aspects and features described in relation to a particular one of the previous examples may also be combined with one or more of the further examples to replace an identical or similar feature of that further example or to additionally introduce the features into the further example.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to examples and examples described herein.

While examples of an example apparatus have been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the proposed concept.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

Examples may further be or relate to a (computer) program including a program code to execute one or more of the above methods when the program is executed on a computer, processor, or other programmable hardware component. Thus, steps, operations, or processes of different ones of the methods described above may also be executed by programmed computers, processors or other programmable hardware components. Examples may also cover program storage devices, such as digital data storage media, which are machine-, processor- or computer-readable and encode and/or contain machine-executable, processor-executable, or computer-executable programs and instructions. Program storage devices may include or be digital storage devices, magnetic storage media such as magnetic disks and magnetic tapes, hard disk drives, or optically readable digital data storage media, for example. Other examples may also include computers, processors, control units, (field) programmable logic arrays ((F)PLAs), (field) programmable gate arrays ((F)PGAs), graphics processor units (GPU), application-specific integrated circuits (ASICs), integrated circuits (ICs) or system-on-a-chip (SoCs) systems programmed to execute the steps of the methods described above.

It is further understood that the disclosure of several steps, processes, operations, or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process, or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

What is claimed is:

1. A forward-error-correction (FEC) encoder that is suitable for generating FEC data for use with hard-decision input at a receiver and for use with soft-decision input at the receiver, comprising:
    Low-Density Parity-Check (LDPC) parity encoder circuitry configured to generate parity bits from payload bits using an LDPC code; and
    puncturing/shortening circuitry configured to puncture and/or shorten the parity bits and/or the payload bits to generate the FEC data,
    wherein the LDPC parity encoder circuitry and the puncturing/shortening circuitry are configured to generate the FEC data either:
    a) using a single LDPC code that is suitable for use with soft-decision input and hard-decision input at the receiver, wherein the LDPC parity encoder circuitry and the puncturing/shortening circuitry are configured to generate the FEC data using the same LDPC code for use with hard-decision input at the receiver and for use with soft-decision input at the receiver, and the FEC data is generated using a single LDPC code that uses a first set of puncturing bits and/or a first set of shortening bits for use with soft-decision input at the receiver and a second set of puncturing bits and/or a second set of shortening bits for use with hard-decision input at the receiver, or
    b) using one of two LDPC codes that are suitable for soft-decision input and hard-decision input, respectively, wherein one of the two LDPC codes is used for use with soft-decision input at the receiver and the other of the two LDPC codes is used for use with hard-decision input at the receiver.

2. The FEC encoder according to claim 1, wherein the FEC data is generated with a single LDPC code where performance is balanced for good performance with hard-decision input and soft-decision input.

3. The FEC encoder according to claim 1, wherein one of the two LDPC codes is optimized for hard-decision input and the other of the two LDPC codes is optimized for soft-decision input.

4. The FEC encoder according to claim 1, wherein one of the two LDPC codes is derived from the other of the two LDPC codes via one or more matrix operations.

5. The FEC encoder according to claim 4, wherein the LDPC code being used for use with soft-decision input is derived from the LDPC code being used for use with hard-decision input via an exchange of columns of a parity matrix of the LDPC code being used for use with hard-decision input.

6. The FEC encoder according to claim 5, wherein the FEC encoder is configured to generate the FEC data by multiplying, segment-wise, the payload bits with a first matrix and with a second matrix, wherein columns of the first and/or second matrix being used to generate FEC data for use with hard-decision input and soft-decision input are multiplied using shared circuitry, and wherein the remaining columns of the first and/or second matrix are multiplied using circuitry that is switched according to the use of soft-decision input or hard-decision input.

7. An Optical Line Terminal (OLT) for a Passive Optical Network (PON) that supports hard-decision input receivers and soft-decision input receivers with a Forward Error Correction (FEC) encoder and a FEC decoder suitable for a hard-decision input setting and a soft-decision input setting, the FEC encoder and the FEC decoder being able to switch between the hard-decision input setting and the soft-decision input setting, the OLT comprising the FEC encoder of claim 1.

8. The OLT according to claim 7, wherein a use of the hard-decision input setting and the soft-decision input setting is determined by a transmission speed used.

9. The OLT according to claim 7, wherein a use of the hard-decision input setting and the soft-decision input setting is determined by a wavelength used.

10. The OLT according to claim 7, wherein the OLT is configured to determine an FEC setting to be used and to communicate the FEC setting to be used to Optical Networking Units (ONUS) of the PON system in an overhead channel, wherein the FEC setting is either the hard-decision input setting or the soft-decision input setting.

11. A forward-error-correction (FEC) decoder that is suitable for use with hard-decision input at a receiver and for use with soft-decision input at the receiver, comprising:
    Low-Density Parity Check (LDPC) decoder circuitry configured to obtain an input signal as Log-Likelihood-Ratio (LLR) values; and decode the input signal using LDPC iterative decoding that is based on an LDPC code; and
    output circuitry configured to generate a binary output from the decoded input signal from the LDPC decoder circuitry,
    wherein the LDPC decoder circuitry is configured to decode the input signal either:
    a) using a single LDPC code that is suitable for use with soft-decision input and hard-decision input at the receiver, wherein the input signal is decoded using the same LDPC code with hard-decision input at the receiver and with soft-decision input at the receiver, and the single LDPC code uses a first set of puncturing bits and/or a first set of shortening bits for use with soft-decision input at the receiver and second set of puncturing bits and/or a second set of shortening bits for use with hard-decision input at the receiver, or
    b) using one of two LDPC codes that are suitable for soft-decision input and hard-decision input, respectively, wherein one of the two LDPC codes is used for use with soft-decision input at the receiver and the other of the two LDPC codes is used for use with hard-decision input at the receiver.

12. An Optical Networking Unit (ONU) for a Passive Optical Network (PON) that supports hard-decision input receivers and soft-decision input receivers with a Forward Error Correction (FEC) encoder and a FEC decoder optimized for a hard-decision input setting and a soft-decision input setting, the encoder and decoder being able to switch between the hard-decision input setting and the soft-decision input setting, the ONU comprising the FEC decoder of claim 11.

13. The ONU according to claim 12, wherein the ONU is configured to receive an FEC setting to be used from an Optical Line Terminal of the PON system in an overhead channel, wherein the FEC setting is either the hard-decision input setting or the soft-decision input setting.

14. The ONU according to claim 12, wherein the ONU is configured to provide a request regarding an FEC setting to be used to an Optical Line Terminal (OLT) of the PON system during training of the ONU, wherein the FEC setting is either the hard-decision input setting or the soft-decision input setting.

* * * * *